(12) United States Patent
Itonaga et al.

(10) Patent No.: US 10,170,352 B2
(45) Date of Patent: Jan. 1, 2019

(54) MANUFACTURING APPARATUS OF SEMICONDUCTOR DEVICE, AND MANUFACTURING METHOD OF SEMICONDUCTOR DEVICE

(71) Applicant: ALPAD Corporation, Tokyo (JP)

(72) Inventors: Shuji Itonaga, Yokohama Kanagawa (JP); Hideto Furuyama, Yokohama Kanagawa (JP); Mitsuyoshi Endo, Yamato Kanagawa (JP)

(73) Assignee: ALPAD CORPORATION, Tokyo (JP)

( * ) Notice: Subject to any disclaimer, the term of this patent is extended or adjusted under 35 U.S.C. 154(b) by 628 days.

(21) Appl. No.: 14/634,881

(22) Filed: Mar. 1, 2015

(65) Prior Publication Data

US 2016/0079112 A1    Mar. 17, 2016

(30) Foreign Application Priority Data

Sep. 12, 2014 (JP) .................................. 2014-187116

(51) Int. Cl.
*H01L 21/683* (2006.01)
*H01L 21/67* (2006.01)

(52) U.S. Cl.
CPC .... *H01L 21/6836* (2013.01); *H01L 21/67132* (2013.01); *H01L 2221/68318* (2013.01);
(Continued)

(58) Field of Classification Search
CPC ...................... H01L 21/6836; H01L 21/27132
(Continued)

(56) References Cited

U.S. PATENT DOCUMENTS

| | | | |
|---|---|---|---|
| 2005/0126694 A1* | 6/2005 | Yamamoto | ......... B29C 63/0013 156/247 |
| 2008/0122119 A1 | 5/2008 | Kian et al. | |

(Continued)

FOREIGN PATENT DOCUMENTS

| | | |
|---|---|---|
| JP | 2011233650 A | 11/1711 |
| JP | 2007-242662 A | 9/2007 |

(Continued)

OTHER PUBLICATIONS

Taiwan Office Action dated Oct. 13, 2016, filed in Taiwan counterpart Application No. 104106387, 6 pages (with translation).

*Primary Examiner* — Michael N Orlando
*Assistant Examiner* — Elizabeth Bradford
(74) *Attorney, Agent, or Firm* — Patterson & Sheridan, LLP

(57) ABSTRACT

A manufacturing apparatus includes a first supporting section to support a first tape section. The first tape section has a first surface facing away from the first supporting section. For example, a semiconductor chip can be disposed on the first surface. A second supporting section of the apparatus supports a second tape section in a facing arrangement with the first tape section. The second tape section has a second surface facing away from the second supporting section. For example, a semiconductor chip can be transferred from the first surface to the second surface in a manufacturing process. A ring element is between the first and second tape sections and surrounds a space between the first and second tape sections. The ring element has a port allowing fluid communication between the space and an outlet port.

17 Claims, 26 Drawing Sheets

(52) U.S. Cl.
CPC ............ *H01L 2221/68322* (2013.01); *H01L 2221/68327* (2013.01); *H01L 2221/68336* (2013.01); *H01L 2221/68363* (2013.01); *H01L 2221/68368* (2013.01); *H01L 2221/68381* (2013.01)

(58) Field of Classification Search
USPC ..................................................... 156/272.2
See application file for complete search history.

(56) References Cited

U.S. PATENT DOCUMENTS

| | | |
|---|---|---|
| 2010/0084096 A1 | 4/2010 | Saito et al. |
| 2011/0260184 A1 | 10/2011 | Furuyama |
| 2014/0231842 A1 | 8/2014 | Akimoto et al. |
| 2014/0239331 A1 | 8/2014 | Oyu et al. |

FOREIGN PATENT DOCUMENTS

| | | |
|---|---|---|
| JP | 2011009422 A | 1/2011 |
| JP | 2011238815 A | 11/2011 |
| JP | 2013030717 A | 2/2013 |
| JP | 2014160736 A | 3/2015 |
| TW | 201408488 A | 3/2014 |
| WO | 2014021198 A1 | 2/2014 |
| WO | 2014132979 A1 | 9/2014 |

\* cited by examiner

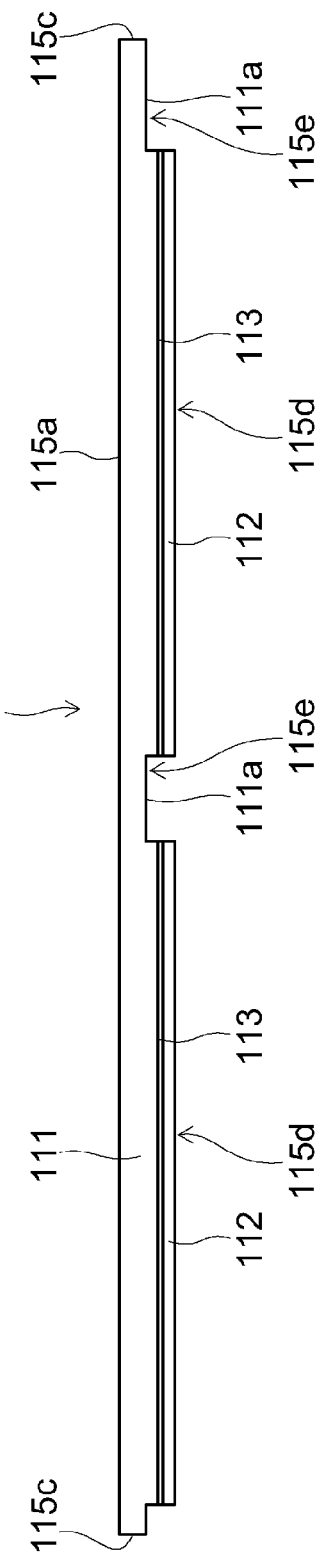

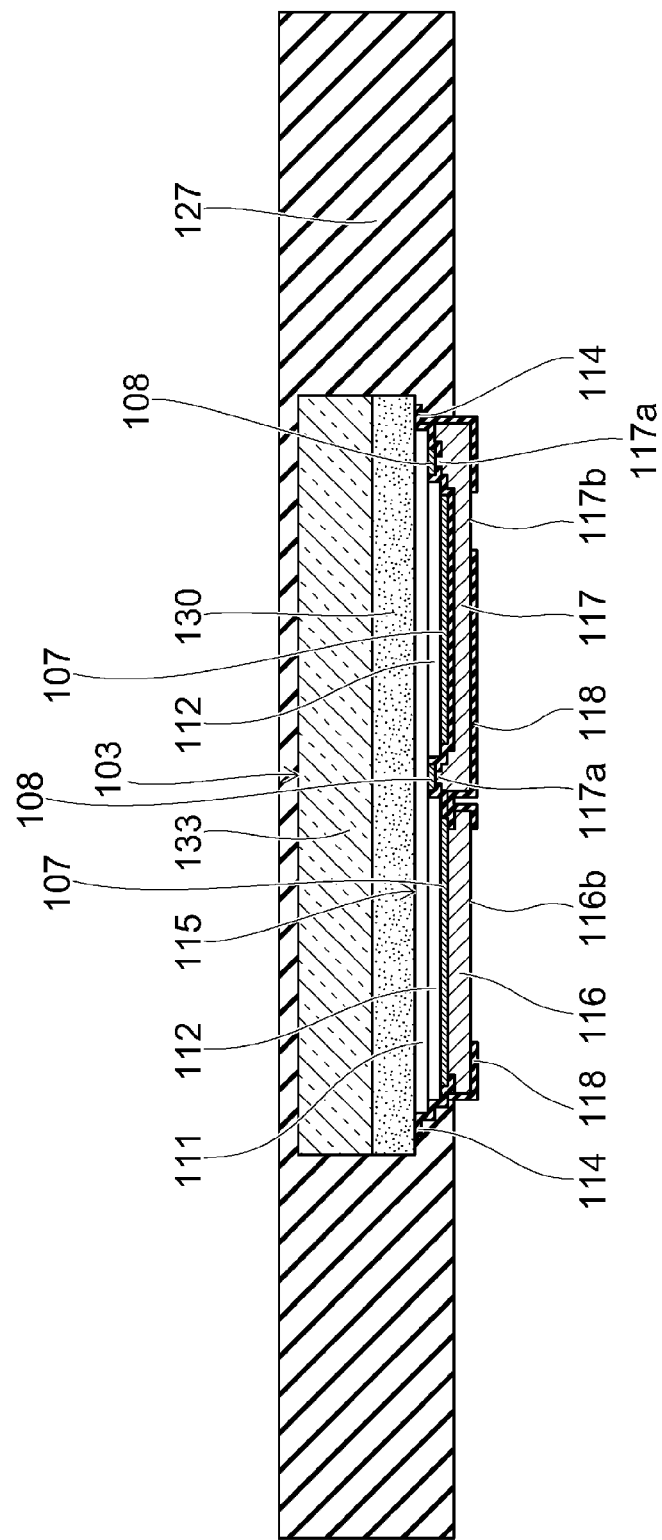

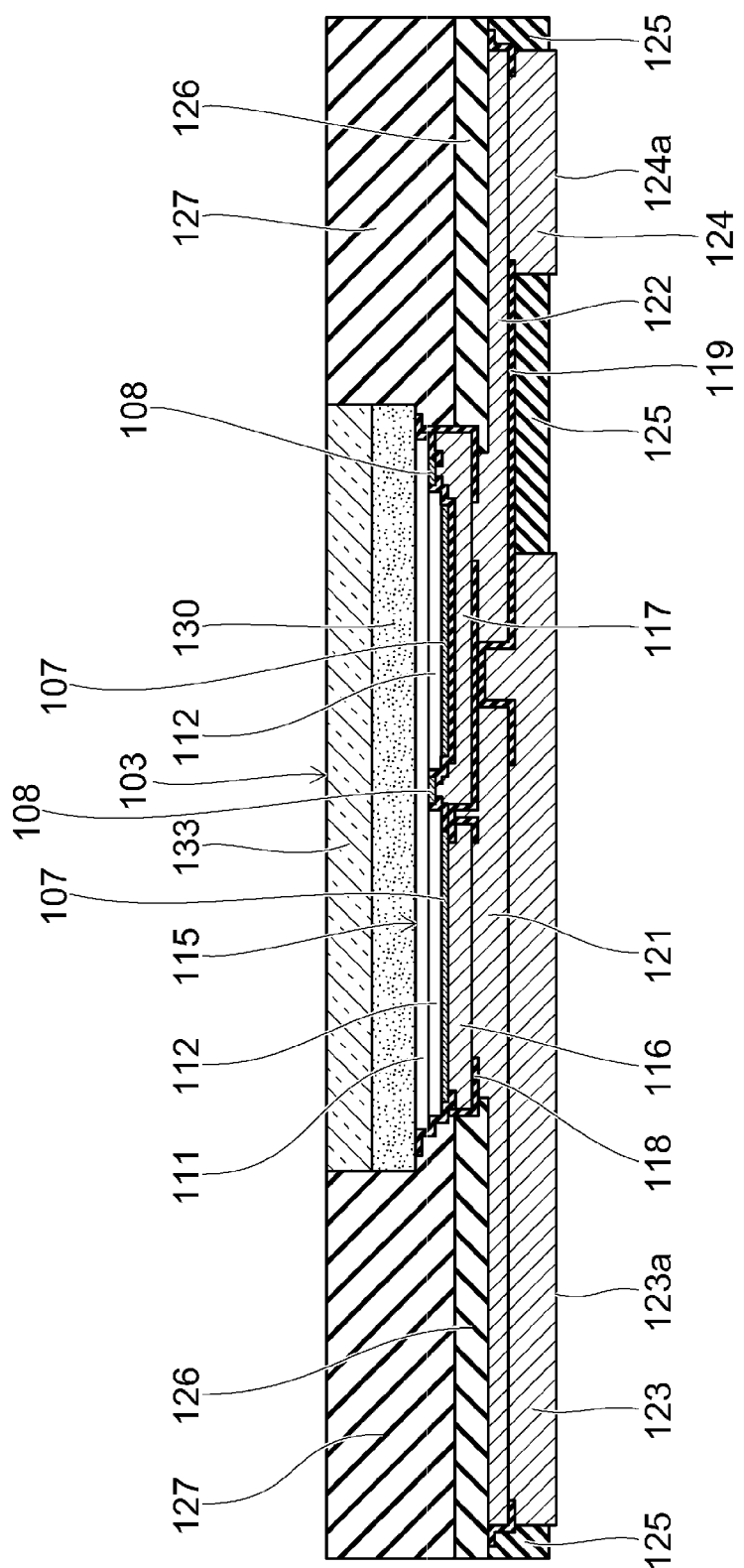

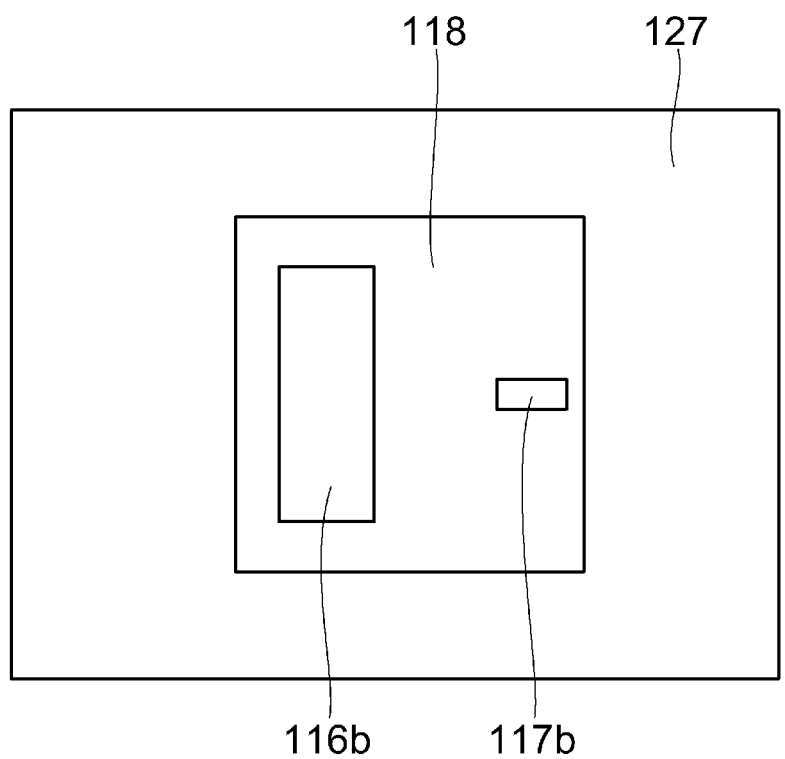

MANUFACTURING APPARATUS OF SEMICONDUCTOR DEVICE, AND MANUFACTURING METHOD OF SEMICONDUCTOR DEVICE

CROSS-REFERENCE TO RELATED APPLICATION

This application is based upon and claims the benefit of priority from Japanese Patent Application No. 2014-187116, filed Sep. 12, 2014, the entire contents of which are incorporated herein by reference.

FIELD

Embodiments described herein relate generally to an apparatus for manufacturing a semiconductor device and a manufacturing method of a semiconductor device.

BACKGROUND

During a manufacturing process for semiconductor devices, the devices may be, for example, transferred from one supporting substrate to another. In some transfer processes, it may be necessary to re-orient the semiconductor device, for example, to expose a surface of the semiconductor previously on, or facing towards, the support substrate. In such transfer processes during manufacturing of the semiconductor device, improvements in positional accuracy of the semiconductor device during and after transference are needed.

DESCRIPTION OF THE DRAWINGS

FIG. 15 is a schematic cross-sectional view illustrating a semiconductor layer.

FIG. 16A and FIG. 16B to FIG. 24 are schematic cross-sectional views illustrating a manufacturing method of a semiconductor device according to a second embodiment.

FIG. 25A and FIG. 25B are schematic plan views illustrating a manufacturing method of a semiconductor device according to the second embodiment.

DETAILED DESCRIPTION

Figure 1:
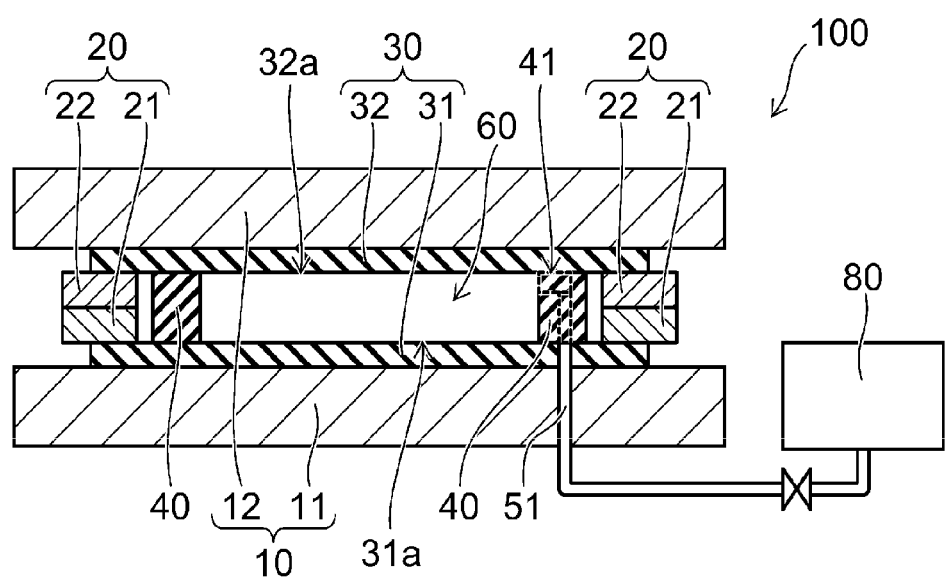
FIG. 1 is a schematic cross-sectional view illustrating a manufacturing apparatus of a semiconductor device according to a first embodiment.

An example embodiment provides a manufacturing apparatus of a semiconductor device. An example method of manufacturing a semiconductor device is also described. The example embodiments provide excellent positional accuracy during device transfer from one supporting substrate to another supporting substrate.

In general, according to an embodiment, a manufacturing apparatus includes first and second supporting sections. The first supporting section is configured to support a first tape section. When thusly supported, the first tape section has a first surface facing away from the first supporting section. For example, a semiconductor chip or a plurality of semiconductor chips can be disposed on the first surface during a manufacturing process. The second supporting section is configured to support a second tape section in a facing arrangement with the first tape section. When thusly supported, the second tape section has a second surface facing away from the second supporting section. A ring element is configured to be between the first and second supporting sections when the first and second tape sections are in the facing arrangement. The ring element disposed at a periphery of a space that is between the first and second tape sections when in the facing arrangement. The ring element in combination with the first and second tape sections can form an enclosed space. The ring element has a port (fluid passage) allowing fluid communication between the space and an outlet port. For example, the space between the first and second tape section can evacuated and vented via the port.

Hereinafter, the example embodiments will be described with reference to the drawings. Furthermore, the same reference numerals are used when a component or element is depicted in different drawings.

FIG. 1 is a schematic cross-sectional view illustrating a manufacturing apparatus of a semiconductor device according to a first embodiment.

A manufacturing apparatus 100 includes a plate section 10, a frame section 20, a tape section 30, and a sealing ring 40.

The plate section 10 includes a lower plate 11 (first supporting section) and an upper plate 12 (second supporting section). On the lower plate 11, the upper plate 12 is provided. The upper plate 12 is parallel to the lower plate 11. As described later, the manufacturing apparatus 100 exhausts air from a space 60 between the lower plate 11 and the upper plate 12. Hence, as a plate section 10, a material which is resistant to deformation is used, and for example, stainless steel (SUS) may be used.

Between the lower plate 11 and the upper plate 12, the frame section 20 is provided. The frame section 20 includes a first frame 21 and a second frame 22. Between the lower plate 11 and the upper plate 12, the first frame 21 is provided. Between the first frame 21 and the upper plate 12, the second frame 22 is provided.

Figure 2:
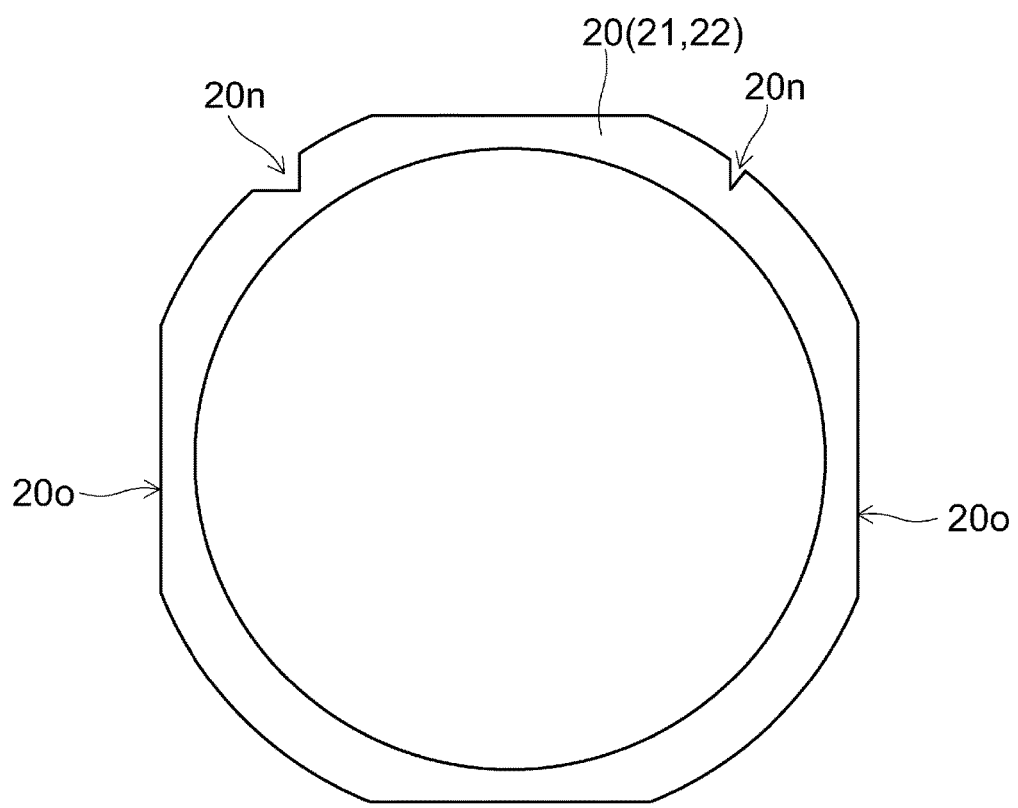
FIG. 2 is a schematic plan view illustrating a frame section of the manufacturing apparatus according to the first embodiment.

FIG. 2 is a schematic plan view illustrating the frame section 20 according to the first embodiment.

As illustrated in FIG. 2, a shape of the frame section 20 is a ring shape, and each of the first frame 21 and the second frame 22 has the same ring shape. For example, an outer diameter of the frame section 20 is 296 mm, an inner diameter thereof is 250 mm, and a thickness (planar thickness) thereof is 1.2 mm. In the same manner as the plate section 10, the material of which is resistant to the deformation (rigid) is used as a frame section 20, and for example, stainless steel may be used.

For example, notch sections 20n and flat sections 20o are provided in the frame section 20. The notch sections 20n and the flat sections 20o are used for an alignment of the frame section 20, for example, within manufacturing apparatus 100. The various notches and flats of the frame section 20 allow the frame section 20 to be accurately positioned.

Between the plate section 10 and the frame section 20, the tape section 30 is provided. The tape section 30 includes a transfer source tape 31 (first tape), and a transfer destination tape 32 (second tape). For a transfer source tape 31 and a transfer destination tape 32, a tape used in substrate dicing processes may be used, for example. For example, a UV curable type tape is used as a transfer source tape 31; such a tape may be designed to become more or less adhesive upon exposure to UV irradiation.

Between the lower plate 11 and the first frame 21, the transfer source tape 31 is provided. The first frame 21 is provided in an outer peripheral section of the transfer source tape 31, that is, the first frame 21 is on the outer periphery of the transfer source tape 31 and may extend in an outward direction (e.g., left/right page direction in FIG. 1) beyond the perimeter of the transfer source tape 31. The first frame 21 disposed in such a manner makes handling of the transfer source tape 31 easier.

The transfer source tape 31 has a first face 31a. Onto the first face 31a, a semiconductor device 70 (see FIG. 7B) is attached. The semiconductor device 70 may be a portion of a semiconductor wafer, for example. A semiconductor wafer including semiconductor device 70 may be in a diced or undiced state when attached to the transfer source tape 31. The transfer source tape 31 is supported by the lower plate 11, on an opposite side of the first face 31a.

Furthermore, for example, a plurality of semiconductor devices 70 may simultaneously disposed on the transfer source tape 31. Diced (singulated) semiconductor devices 70 may be referred to as semiconductor "chips." The number of semiconductor chips is arbitrary, and similarly the number of times semiconductor chips are transferred is arbitrary as is the initial orientation of the semiconductor chips on the transfer source tape 31.

Between the upper plate 12 and the second frame 22, the transfer destination tape 32 is provided. The second frame 22 is provided in the outer peripheral section of the transfer destination tape 32. That is, the first frame 22 is on the outer periphery of the transfer destination tape 32 and may extend in an outward direction (e.g., left/right page direction in FIG. 1) beyond the perimeter of the transfer destination tape 32. The second frame 22 makes the handling of the transfer destination tape 32 easier.

The transfer destination tape 32 has a second face 32a. The semiconductor device 70 will be eventually attached onto the second face 32a (see FIG. 10B). The transfer destination tape 32 is supported on the opposite side of the second face 32a by the upper plate 12.

The second face 32a of the transfer destination tape 32 is opposed to the first face 31a of the transfer source tape 31 across the space 60. Hence, the semiconductor device 70, which is initially attached onto the first face 31a, is subsequently attached onto the second face 32a. In this manner, the exposed surface of the semiconductor device 70 may be reversed after a transfer process. That is, if initially a bottom (back-side) face of the semiconductor device 70 is facing a first supporting substrate, after attachment to second face 32a, the upper (front-side) face of the semiconductor device 70 will be facing a second supporting substrate and the bottom (back-side) face will be exposed and available for additional fabrication steps.

Between the transfer source tape 31 and the transfer destination tape 32, the space 60 and the sealing ring 40 are provided. The space 60 is between the first face 31a and the second face 32a, and the sealing ring 40 surrounds a periphery of the space 60. The sealing ring 40 is provided with an exhaust hole 41.

Figure 3:
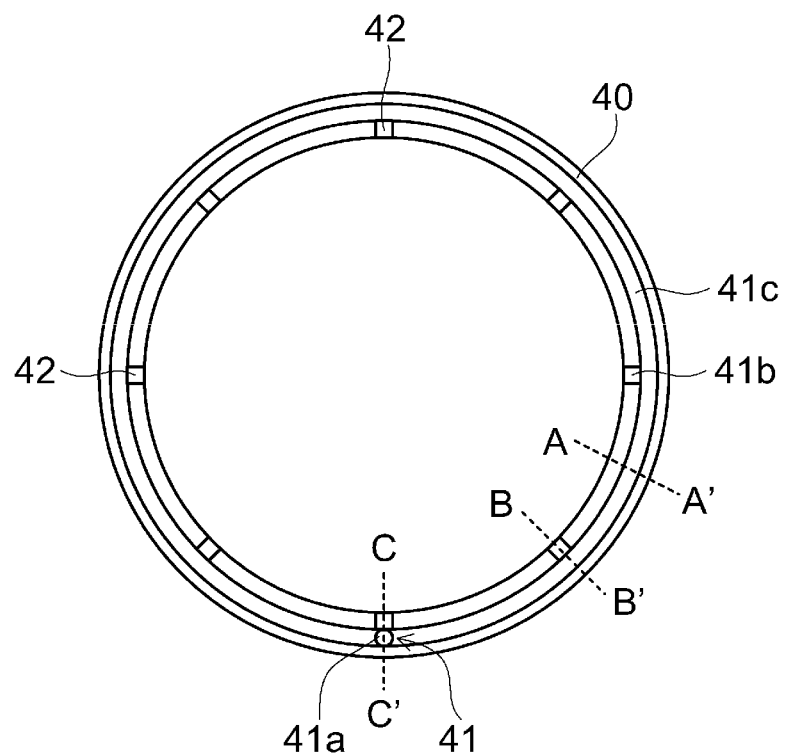
FIG. 3 is a schematic plan view illustrating a sealing ring of the manufacturing apparatus according to the first embodiment.

FIG. 3 is a schematic plan view illustrating the sealing ring 40.

Figure 4A:
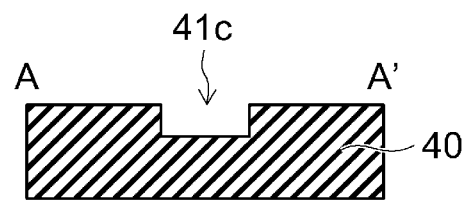
FIG. 4A to FIG. 4C are schematic cross-sectional views illustrating the sealing ring according to the first embodiment.
Figure 4B:
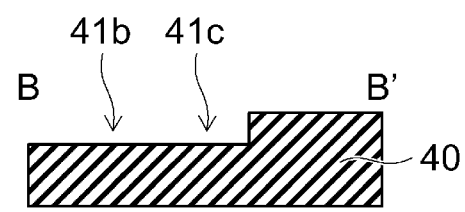
Figure 4C:
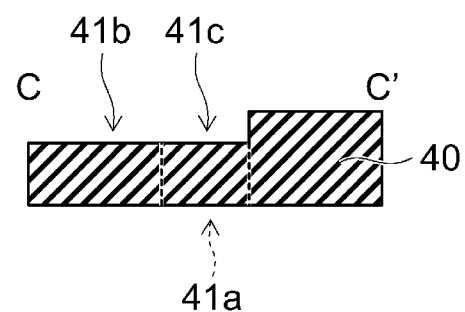

FIG. 4A to FIG. 4C are schematic cross-sectional views illustrating the sealing ring 40.

FIG. 4A, FIG. 4B, and FIG. 4C are a cross-sectional view taken along a A-A' line in FIG. 3, a cross-sectional view taken along a B-B' line in FIG. 3, and a cross-sectional view taken along a C-C' line in FIG. 3, respectively.

As illustrated in FIG. 3, the shape of the sealing ring 40 is the ring shape. As a sealing ring 40, for example, the material having sealing properties is used. For example, the sealing ring 40 includes silicone rubber, silicone resin, metal, urethane resin, or the like. For example, the outer diameter of the sealing ring 40 is 250 mm, the inner diameter thereof is 210 mm, and the thickness (planar) thereof is 3 mm. The exhaust hole (port) 41 within the sealing ring 40 is provided with a vertical hole 41a (intake and exhaust line, fluid pathway or passage), a horizontal hole (fluid pathway or passage) 41b, and a connection section 41c.

As illustrated in FIG. 3 and FIG. 4C, the vertical hole 41a is extended in a thickness direction of the sealing ring 40. For example, the shape of the vertical hole 41a is a cylindrical shape. A diameter of the vertical hole 41a is, for example, 5 mm.

As illustrated in FIG. 3 and FIG. 4B, on an inner periphery of the sealing ring 40, a plurality of horizontal holes 41b are provided to be spaced from each other in a circumferential direction of the sealing ring 40. The horizontal holes 41b communicate with the space 60 inside of the sealing ring 40. The number of horizontal holes 41b is arbitrary. For example, a width of the horizontal hole 41b is 5 mm, and a depth thereof is 2 mm. For example, the horizontal holes 41*b* are provided along the circumferential direction, and are provided at same intervals. For example, the horizontal hole 41*b* has a concave shape, and may have a V shape, a U shape, or the like.

As illustrated in FIG. 3 and FIG. 4A, between the outer periphery and the inner periphery of the sealing ring 40, the connection section 41*c* which is extended in the circumferential direction, is arranged. For example, the width of the connection section 41*c* is 5 mm, and the depth thereof is 2 mm.

The connection section 41*c* has the concave shape on an upper face of the sealing ring 40. The connection section 41*c* may have the concave shape, for example, on a bottom face of the sealing ring 40. The connection section 41*c* may have other shapes (for example, the V shape, the U shape, or the like) in addition to the concave shape. Hereby, the connection section 41*c* is connected to the vertical hole 41*a* and the horizontal hole 41*b*.

As illustrated in FIG. 1, the sealing ring 40 is provided on the inside (within the inner diameter) of the frame section 20. That is, the diameter of the sealing ring 40 is equal to or less than each diameter of the first frame 21 and the second frame 22. A side face of the outside of the sealing ring 40 may come into contact with the side face of the inside of the frame section 20, or may not come into contact with the side face of the inside of the frame section 20.

The planar thickness of the sealing ring 40 is greater than the thickness which is obtained by superposing (summing) the respective planar thickness of the first frame 21 and the second frame 22. Therefore, when the first frame 21 and the second frame 22 are superposed, each of the transfer source tape 31 and the transfer destination tape 32 is adhered to the sealing ring 40. Hereby, the upper face and a lower face of the space 60, which are surrounded by the sealing ring 40, are entirely covered with the tape section 30. At this time, the space 60 is connected to (in fluid communication with) the connection section 41*c* through the horizontal hole 41*b* of the sealing ring 40. The connection section 41*c* can in turn be connected to (in fluid communication) with an outlet or exhaust port of the apparatus 100.

A through hole 51 (intake and exhaust introduction line/port) is provided by penetrating the inside of the lower plate 11, and the transfer source tape 31. For example, the through hole 51 is connected to an exhaust hole 41, and a vacuum exhaust section 80. Hereby, the vacuum exhaust section 80 may exhaust the air from the space 60 through the exhaust hole 41.

Figure 12:
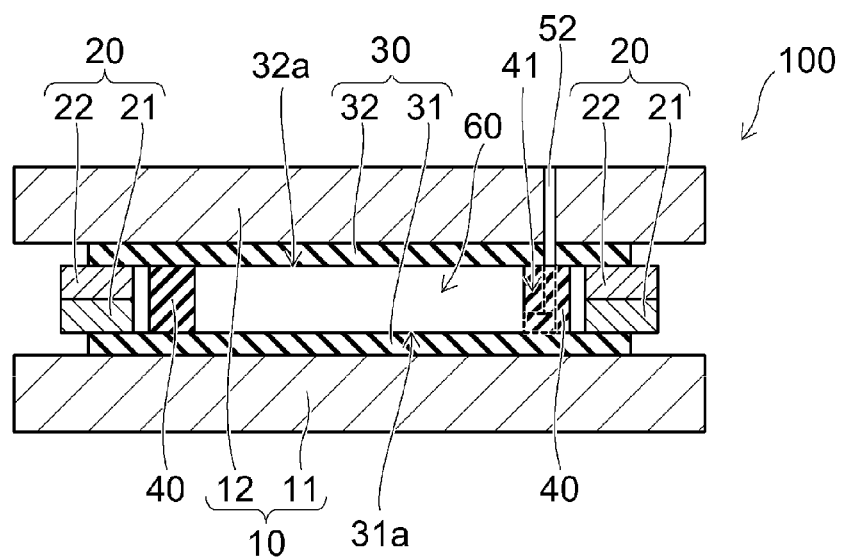
FIG. 12 is a schematic cross-sectional view illustrating an aspect of the manufacturing apparatus of a semiconductor device according to the first embodiment.

For example, as illustrated in FIG. 12, a through hole 52 may be used, instead of the through hole 51. The through hole 52 penetrates the inside of the upper plate 12 and the transfer destination tape 32.

The semiconductor device 70 is attached to the first face 31*a* of the transfer source tape 31. Each of the transfer source tape 31 and the transfer destination tape 32 comes into contact with the sealing ring 40. At this time, the air of the space 60 can be exhausted through the exhaust hole 41. Hereby, the first face 31*a* of the transfer source tape 31 and the second face 32*a* of the transfer destination tape 32 come close to each other (approach each other), and the upper face of the semiconductor device 70 can thereby be attached to the second face 32*a*.

Thereafter, the air is supplied into the space 60 (for example, the space 60 is opened to the atmosphere or is pressurized by the supplied air) through the exhaust hole 41. In this instance, adhesive properties of the first face 31*a* with respect to the semiconductor device 70 were set so as to be lower than the adhesive properties of the second face 32*a* with respect to the semiconductor device 70. Therefore, the semiconductor device 70 is peeled from the first face 31*a* and remains attached to the second face 32*a*. That is, the semiconductor device 70 is transferred to the second face 32*a* from the first face 31*a*.

However, in the state where the semiconductor device 70 is attached to each of the transfer source tape 31 and the transfer destination tape 32, if the semiconductor device 70 is peeled off by the peeling of the transfer source tape 31, a peeling load which is supplied to the transfer source tape 31 and the transfer destination tape 32, becomes large. Hereby, the peeling is unlikely to be appropriately performed. The tape sections may, for example, detach from the frame section 20. Furthermore, the position of the semiconductor devices 70 where the tape stretches deviates.

In contrast, according to the first embodiment, in the state where the semiconductor device 70 is attached to each of the transfer source tape 31 and the transfer destination tape 32, the air is supplied into the space 60 through the exhaust hole 41, and the semiconductor device 70 is consequently peeled off from the transfer source tape 31. At this time, each of the transfer source tape 31 and the semiconductor device 70 is uniformly pressurized. Hereby, it is possible to perform the transfer to the transfer destination tape 32 without the deviation of the position of the semiconductor device 70.

Figure 5:
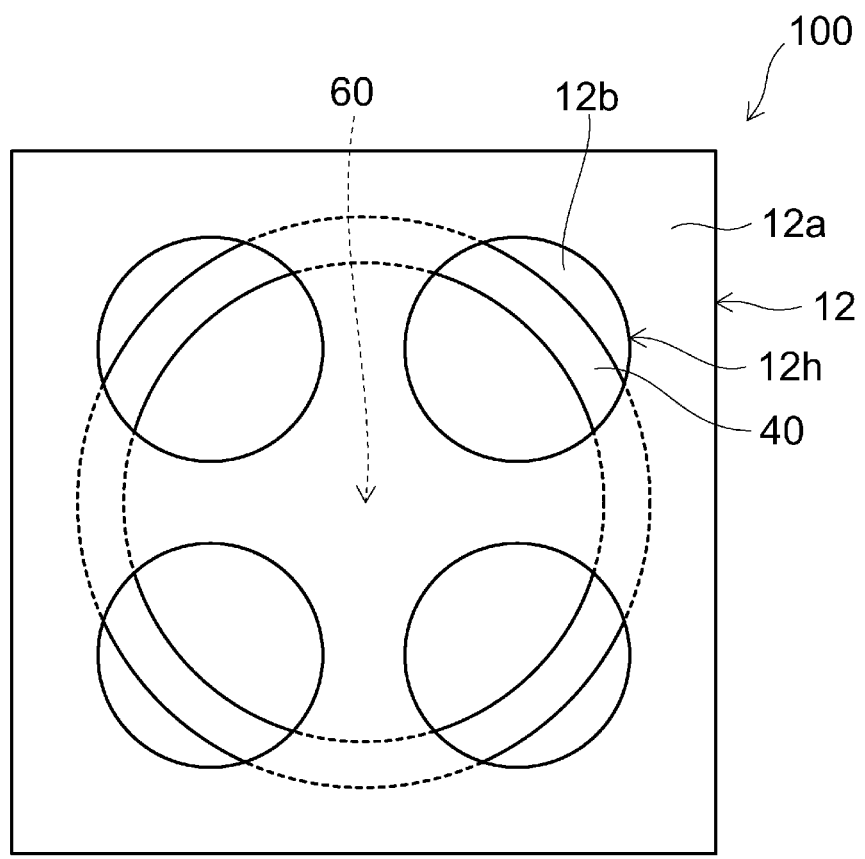
FIG. 5 is a schematic plan view illustrating the manufacturing apparatus of a semiconductor device according to the first embodiment.

FIG. 5 is a schematic plan view illustrating the manufacturing apparatus according to the first embodiment.

As illustrated in FIG. 5, for example, the manufacturing apparatus 100 includes a reinforcing plate 12*a*, and a transparent plate 12*b*. The transparent plate 12*b* is provided between the reinforcing plate 12*a* and the transfer destination tape 32. As a transparent plate 12*b*, for example, an acrylic plate can be used.

In the reinforcing plate 12*a* a through hole 12*h* penetrates the reinforcing plate 12*a*. On the bottom face of the through hole 12*h*, the transparent plate 12*b* is exposed. It is thus possible to visually observe the sealing ring 40 and the space 60 through the transparent plate 12*b*. Thus, it is possible to confirm a transfer state of the semiconductor device 70. The reinforcing plate 12*a* has, in general, mechanical strength which is higher than that of the transparent plate 12*b*, and for example, is made up of the stainless steel. The reinforcing plate 12*a* suppresses the deformation of the transparent plate 12*b* which may result by pressurization and decompression of the space 60.

Figure 6A:
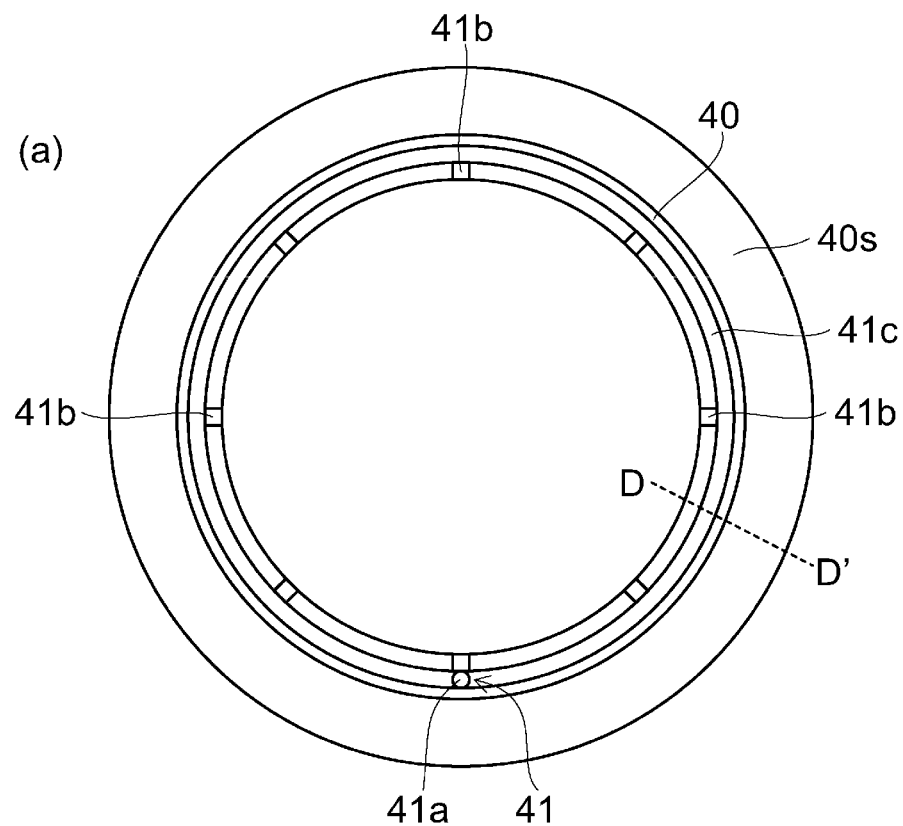
FIG. 6A is a schematic plan view illustrating the sealing ring according to the first embodiment.
Figure 6B:
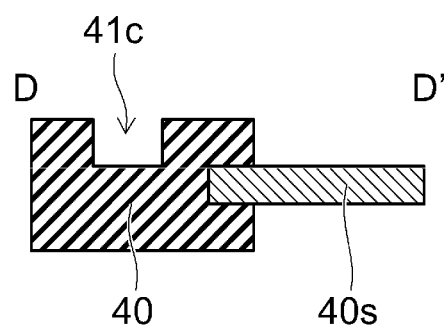
FIG. 6B is a schematic cross-sectional view illustrating the sealing ring according to the first embodiment.

FIG. 6A is a schematic plan view illustrating the sealing ring 40 according to the embodiment, and FIG. 6B is a schematic cross-sectional view illustrating the sealing ring 40 according to the embodiment.

FIG. 6B is a cross-sectional view taken along a D-D' line in FIG. 6A.

As illustrated in FIG. 6A and FIG. 6B, for example, the sealing ring 40 includes a support section 40*s*. The support section 40*s* is provided into the ring shape in the outer peripheral section of the sealing ring 40. The thickness of the support section 40*s* is larger than the thickness of the sealing ring 40.

When the sealing ring 40 is installed on the inside of the frame section 20, the support section 40*s* is provided between the sealing ring 40 and the frame section 20. An inner peripheral section of the support section 40*s* is surrounded by the side face of the outside of the sealing ring 40. The support section 40*s* makes the handling of the sealing ring 40 easy. Hereby, it is possible to uniformly provide the sealing ring 40 along the inside of the frame section 20. Therefore, when the air is supplied into the space 60 through the exhaust hole 41, and the semiconductor device 70 is peeled off from the transfer source tape 31, the transfer source tape 31 and the semiconductor device 70 are uniformly pressurized. Hereby, position accuracy during transferring the semiconductor device 70 is improved.

Next, a manufacturing method of a semiconductor device will be described with reference to FIG. 7A to FIG. 11.

FIG. 7A, FIG. 8A, FIG. 9A and FIG. 10A are schematic perspective views illustrating the manufacturing apparatus 100. FIG. 7B, FIG. 8B, FIG. 9B, FIG. 10B and FIG. 11 are schematic cross-sectional views illustrating the manufacturing apparatus 100.

Figure 7A:
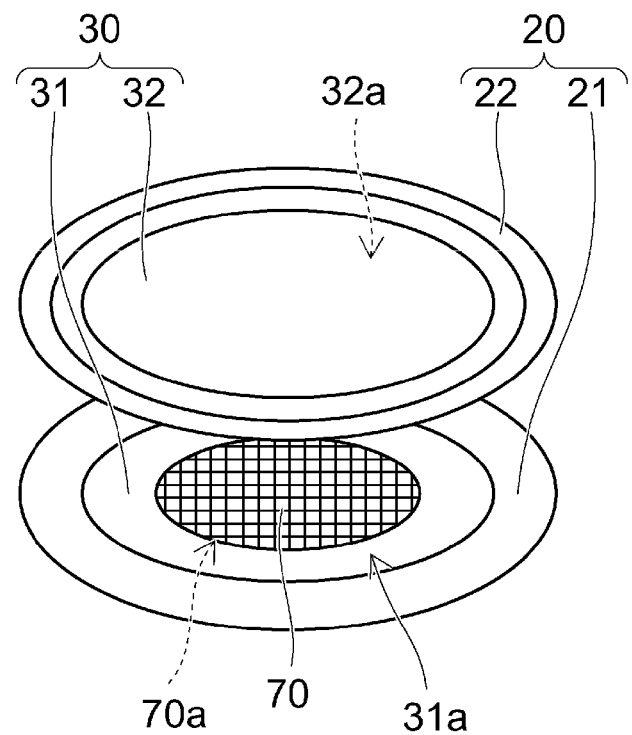
FIG. 7A is a schematic perspective view illustrating a first aspect of a manufacturing method of a semiconductor device.
Figure 7B:
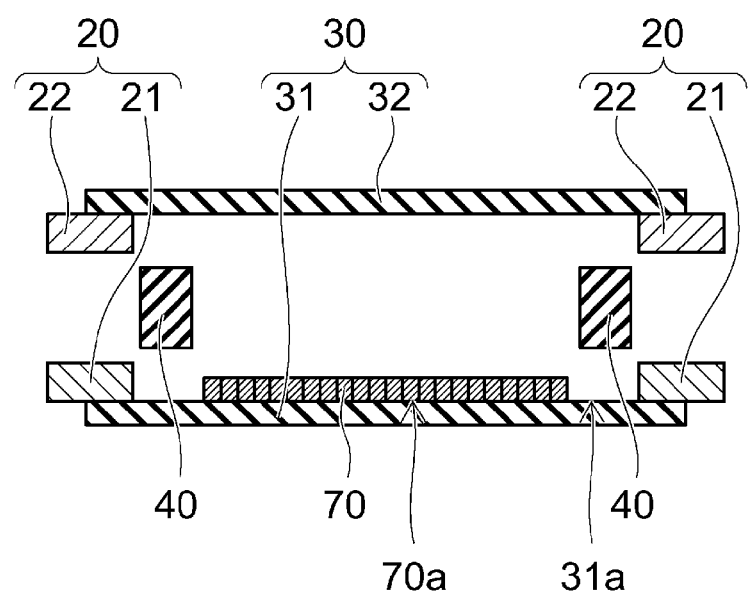
FIG. 7B is a schematic cross-sectional view illustrating the first aspect of the manufacturing method.

As shown in FIG. 7A and FIG. 7B, on the first face 31a of the transfer source tape 31, a first portion (first surface) 70a of the semiconductor device 70 is disposed. The first frame 21 with transfer source tape 31 installed therein is positioned outwardly (with respect to the central portion of first frame 21) the semiconductor device 70. The number of the semiconductor devices 70 disposed on the transfer source tape 31 is arbitrary.

The transfer destination tape 32, which is opposed to the transfer source tape 31, is placed adjacent to the semiconductor device 70. Between the first frame 21 and the transfer destination tape 32, the second frame 22 is installed. The second frame 22 comes into contact with the transfer destination tape 32.

Thereafter, between the transfer source tape 31 and the transfer destination tape 32, the sealing ring 40 is installed. The sealing ring 40 is installed inwardly (with respect to an outer section) of the first frame 21 and the second frame 22.

Figure 8A:
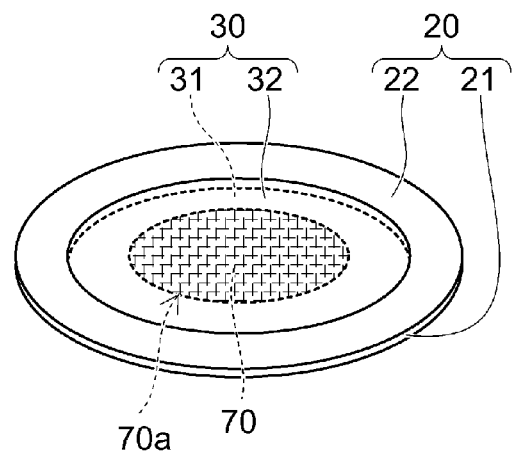
FIG. 8A is a schematic perspective view illustrating a second aspect of the manufacturing method of a semiconductor device according.
Figure 8B:
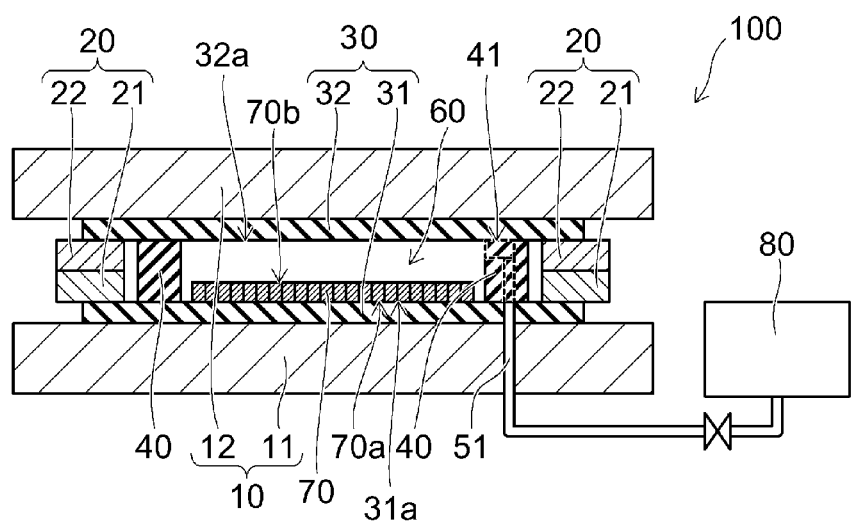
FIG. 8B is a schematic cross-sectional view illustrating the second aspect of manufacturing method.

Next, as illustrated in FIG. 8A and FIG. 8B, the first frame 21 is positioned so as to come into contact with the second frame 22. Hereby, each of the transfer source tape 31 and the transfer destination tape 32 comes into contact with the sealing ring 40. The semiconductor device 70 and the space 60 are surrounded by the transfer source tape 31, the transfer destination tape 32, and the sealing ring 40 in combination.

Figure 9A:
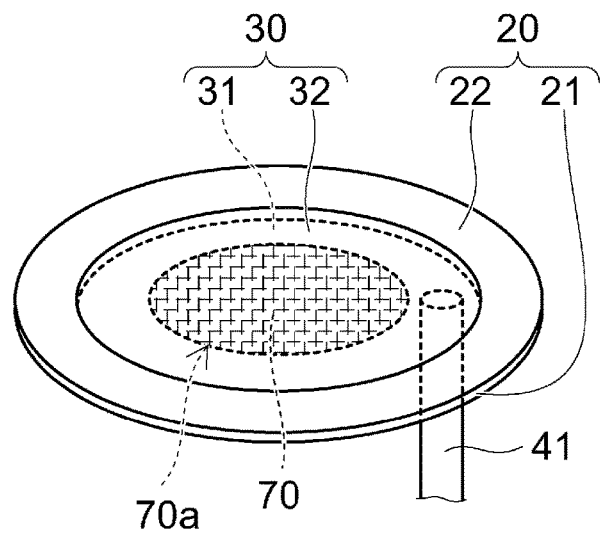
FIG. 9A is a schematic perspective view illustrating a third aspect of the manufacturing method of a semiconductor device.
Figure 9B:
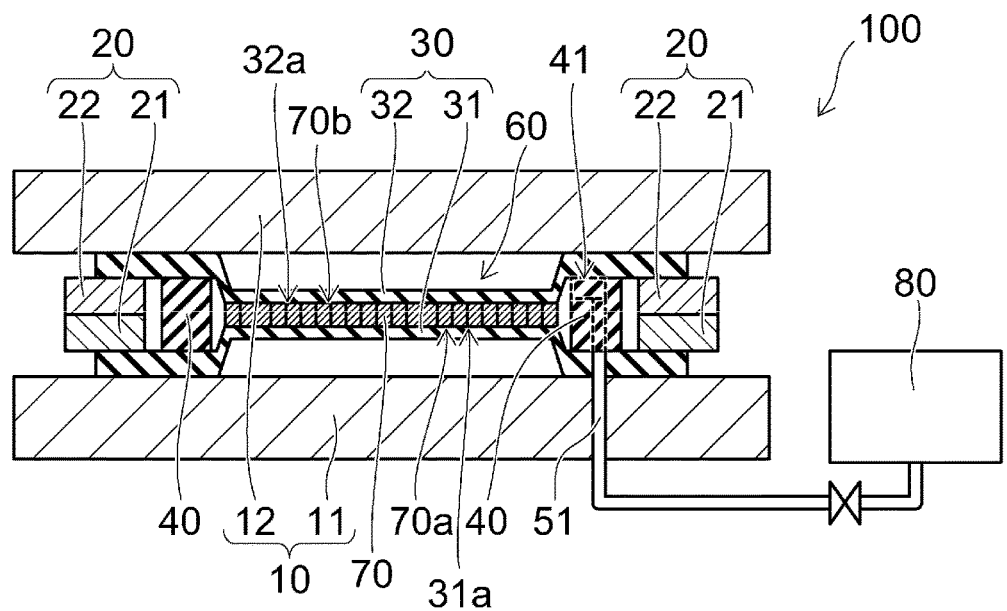
FIG. 9B is a schematic cross-sectional view illustrating the third aspect of the manufacturing method of a semiconductor device.

As illustrated in FIG. 9A and FIG. 9B, the air is exhausted from the space 60 through the exhaust hole 41. Hereby, a second portion (second surface) 70b which opposing to the first portion 70a of the semiconductor device 70, is attached to the second face 32a of the transfer destination tape 32. In the exhausting of the air from the space 60, for example, the vacuum exhaust section 80 including a vacuum pump is used. The vacuum exhaust section 80 is connected to the exhaust hole 41 through the through hole 51.

Figure 10A:
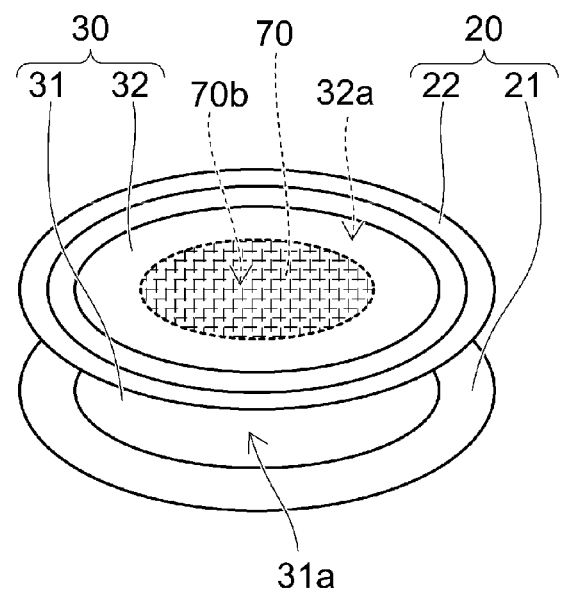
FIG. 10A is a schematic perspective view illustrating a fourth aspect of the manufacturing method of a semiconductor device.
Figure 10B:
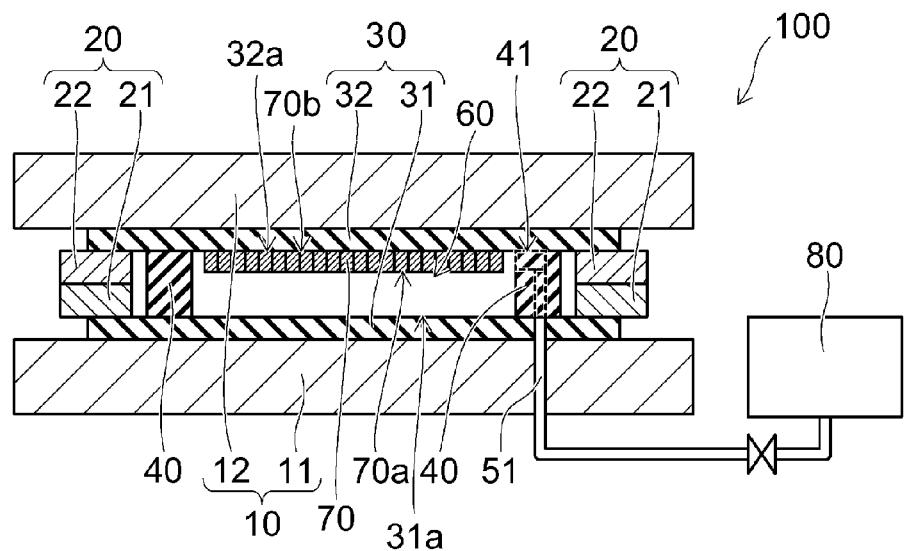
FIG. 10B is a schematic cross-sectional view illustrating the fourth aspect of the manufacturing method of a semiconductor device.

As illustrated in FIG. 10A and FIG. 10B, the air is supplied into the space 60 through the exhaust hole 41. Before the vacuum exhausting, the adhesive force between the first portion 70a of the semiconductor device 70 and the first face 31a of the transfer source tape 31 can be weakened by, for example, UV irradiation of the transfer source tape 31.

As illustrated in FIG. 9B, the first portion 70a is attached to the first face 31a while the second portion 70b is also attached to the second face 32a. The adhesive force between the semiconductor device 70 and the transfer source tape 31 can be set (or made) to be weaker than the adhesive force between the semiconductor device 70 and the transfer destination tape 32. Therefore, when air supplied into the space 60 (by, for example, opening of the space 60 to the atmosphere), the semiconductor device 70 will be peeled off from the first face 31a of the transfer source tape 31.

Thereafter, the first frame 21 and the second frame 22 are separated from each other, and the transfer process of the semiconductor device 70 is accomplished.

By performing the exhausting of the air from the space 60 through the exhaust hole 41, the semiconductor device 70 is attached to the second face 32a of the transfer destination tape 32. In this manner, force is uniformly applied to the transfer destination tape 32, and it is thus possible to reduce the deviation (e.g., kerf shift) between the plurality of semiconductor devices 70 which would otherwise be caused by the stretching of the transfer tape section 30.

Furthermore, by supplying air into the space 60 through the exhaust hole 41, the semiconductor device 70 is peeled off from the transfer source tape 31. At this time, each of the transfer source tape 31 and the semiconductor device 70 is uniformly pressurized. Hereby, it is possible to perform the transfer to the transfer destination tape 32 without the deviation of the position of the semiconductor device 70.

As described above, the example embodiments may provide a manufacturing apparatus of a semiconductor device and the manufacturing method having excellent positional accuracy in a device transfer process.

Figure 11:
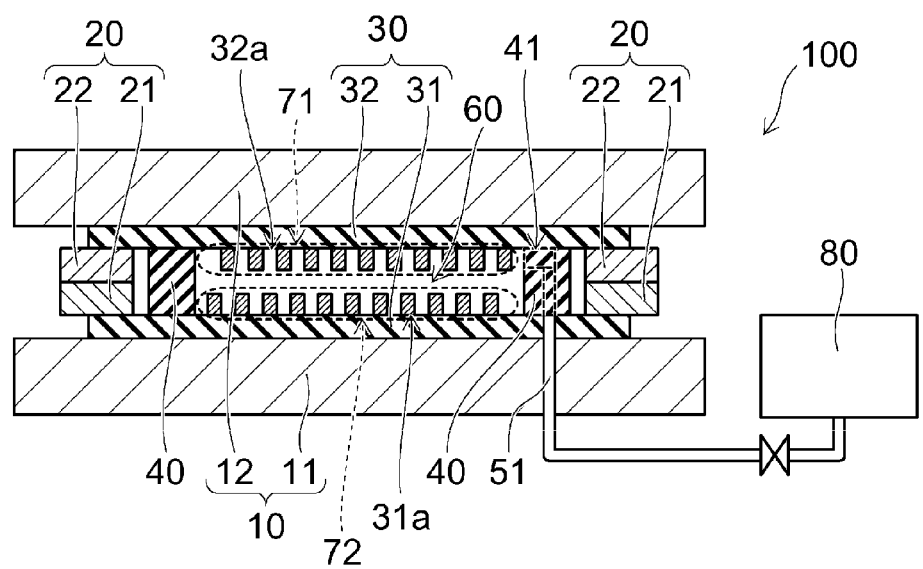
FIG. 11 is a schematic cross-sectional view illustrating a fifth aspect of the manufacturing method of a semiconductor device.

For example, the semiconductor device 70 is one of a plurality of semiconductor chips which are to be separated on the transfer source tape 31 and as illustrated in FIG. 11, only a portion (first group) 71 of the plurality of semiconductor chips is to be transferred to the transfer destination tape 32 from the transfer source tape 31, and a remaining portion (second group) 72 of the plurality of semiconductor chips is to remain attached to the transfer source tape 31. That is, it is possible to selectively transfer specific chips (semiconductor devices 70) in the plurality of semiconductor chips from a first supporting substrate to a second supporting substrate.

As a selection method for selective transference of semiconductor chips may incorporate selective a UV irradiation of those portion is of the transfer source tape 31 attached to the semiconductor chips selected for transfer to transfer destination tape 32. For example, when the semiconductor chip is installed on the transfer source tape 31, the semiconductor chip intending to be transferred, is selectively irradiated with UV to weaken the adhesive force between transfer source tape 31 and the selected semiconductor device 70. Hereby, only semiconductor chips which are irradiated with the UV are transferred to the transfer destination tape 32.

Figure 13:
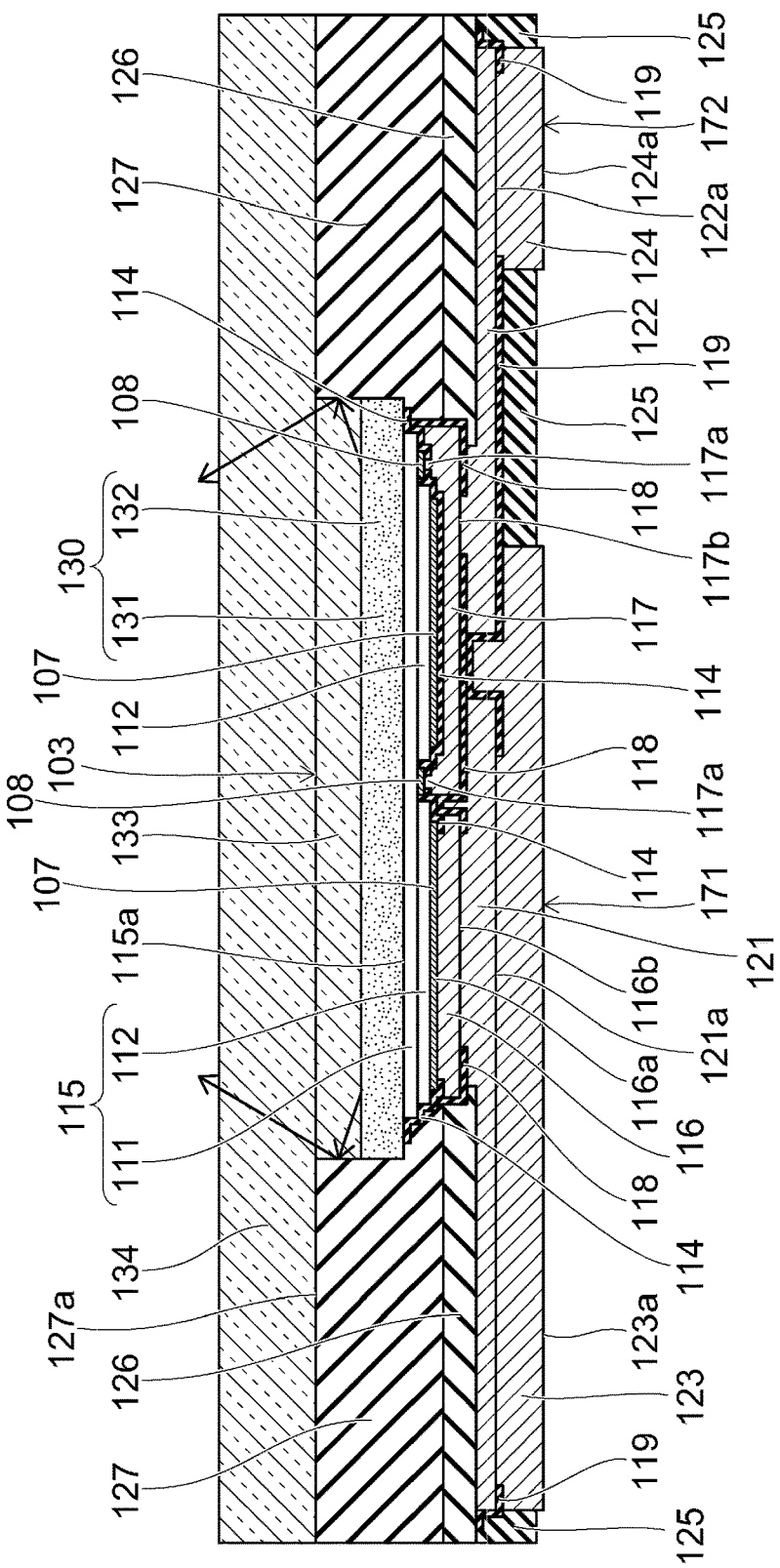
FIG. 13 is a schematic cross-sectional view illustrating a semiconductor device.

Even in this case, it is possible to provide the manufacturing apparatus of a semiconductor device which is excellent in positional accuracy during the transfer. FIG. 13 is a schematic cross-sectional view illustrating a semiconductor device which may be manufactured according to the first embodiment.

Figure 14:
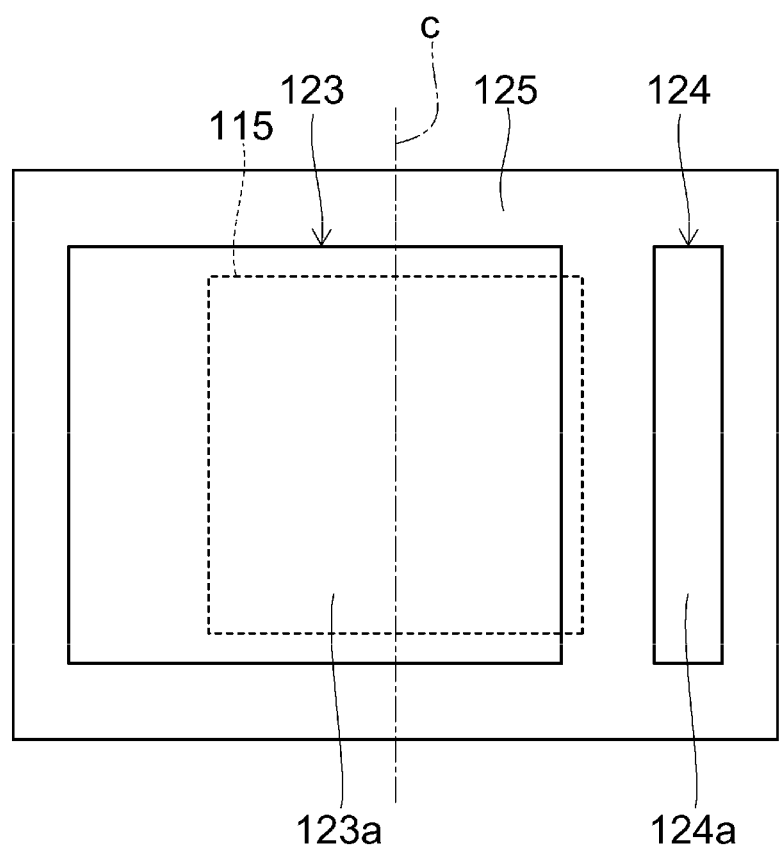
FIG. 14 is a schematic plan view illustrating a semiconductor device.

FIG. 14 is a schematic plan view illustrating an installation face side of the semiconductor device depicted in FIG. 13, and corresponds to a lower face view in of the device depicted in FIG. 13.

For example, the semiconductor device which is manufactured using the manufacturing apparatus according to the first embodiment, includes a chip-sized device (chip or semiconductor chip) 103 which is formed on a wafer substrate, for example. A packaged chip 103 may include an insulating member 127, which is provided surrounding a peripheral portion of the chip 103, and metal layer 171 and 172 which are provided on the installation face side of the chip 103.

The chip 103 has electrodes 107 and 108, first wiring layers (on-chip wiring layers) 116 and 117, optical layers 130 and 133, and a semiconductor layer 115, which is provided between the first wiring layers 116 and 117 and the optical layers 130 and 133.

FIG. 15 is a schematic enlarged cross-sectional view illustrating the semiconductor layer 115.

The semiconductor layer 115 includes, for example, gallium nitride. The semiconductor layer 115 includes a first layer 111 including an n type semiconductor, a second layer 112 including a p type semiconductor, and a light emitting layer 113 which is provided between the first layer 111 and the second layer 112.

For example, the first layer 111 includes a grounding buffer layer, and an n type GaN layer. For example, the second layer 112 includes a p type GaN layer. The light emitting layer 113 includes a material emitting blue light, violet light, blue violet light, ultraviolet light, or the like. A light emitting peak wavelength of the light emitting layer 113 is, for example, 430 nm to 470 nm.

Figure 16A:
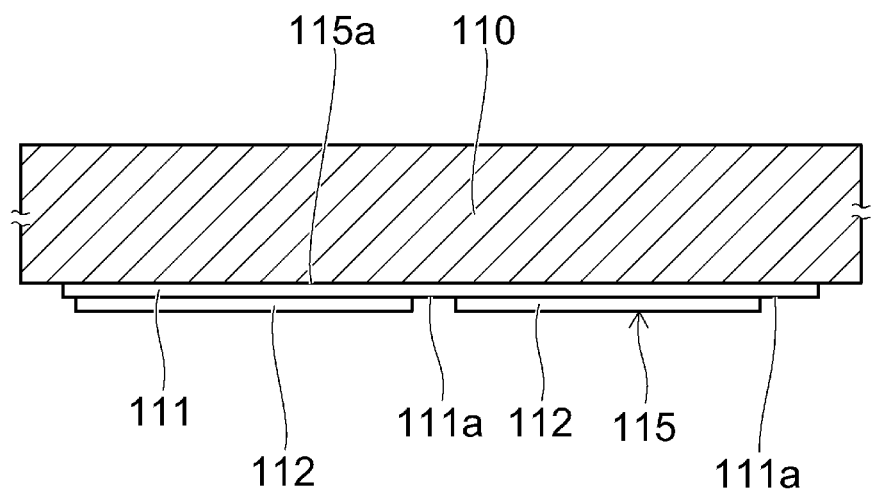

As illustrated in FIG. 16A, the semiconductor layer 115 is subjected to epitaxial-growth on a substrate 110. For example, the substrate 110 is a silicon substrate, a sapphire substrate, a silicon carbide substrate, or the like. On the substrate 110, the first layer 111, the light emitting layer 113, and the second layer 112 are provided in a stacked arrangement by epitaxial-growth. Thereafter, by a reactive ion etching (RIE) method using a mask (not specifically depicted in the drawing), portions of the second layer 112 and the light emitting layer 113 are selectively removed.

Therefore, the semiconductor layer 115 has a region (light emitting region) 115d having a layered film of the second layer 112 and the light emitting layer 113, and a region 115e having a second face 111a of the first layer 111 which is not covered with the light emitting layer 113 and the second layer 112.

Figure 16B:
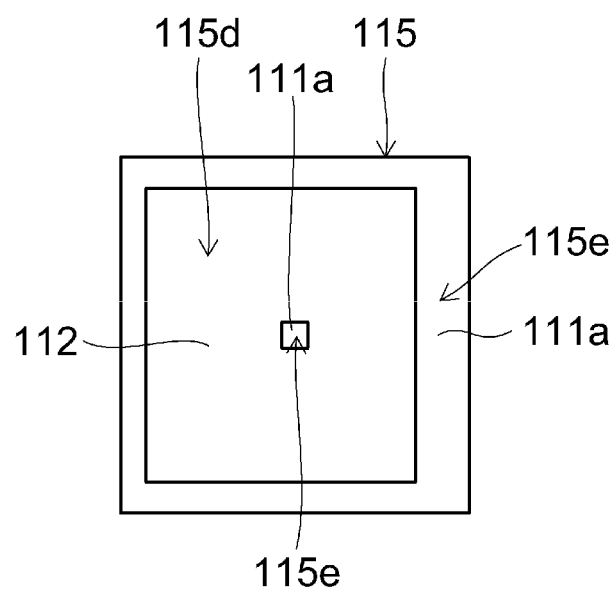

FIG. 16B corresponds to a lower face view illustrating the semiconductor layer 115 which is illustrated in FIG. 15 and FIG. 16A.

As illustrated in FIG. 16B, for example, the region 115e is formed into an island shape which is surrounded by the light emitting region 115d. Moreover, the region 115e is formed on the outer peripheral side of the light emitting region 115d so as to continuously surround the light emitting region 115d. An area of the light emitting region 115d is larger than the area of the region 115e.

As illustrated in FIG. 15, a first face 115a, which is not covered with the light emitting layer 113 and the second layer 112, is formed on the opposite side of the second face 111a in the first layer 111. Moreover, the semiconductor layer 115 has a side face 115c which is continued to the first face 115a.

Figure 17A:
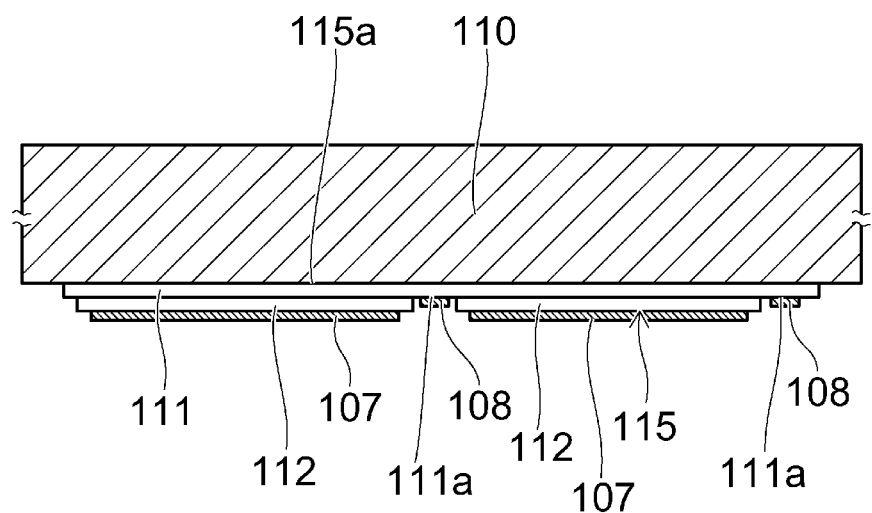
Figure 17B:
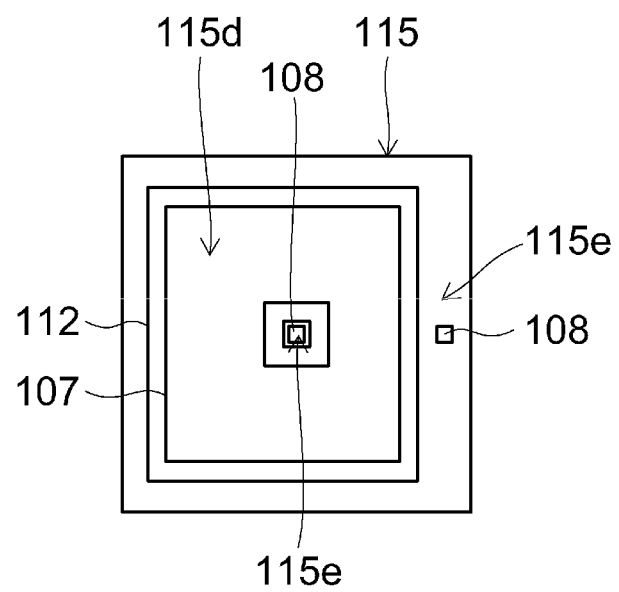

As illustrated in FIG. 17A and FIG. 17B corresponding to a lower face view of FIG. 17A, the n-side electrode 108 is provided on the second face 111a of the first layer 111. The p-side electrode 107 is provided on a surface of the second layer 112. The p-side electrode 107 and the n-side electrode 108 are formed within a perimeter of a region (chip region) overlapping with the semiconductor layer 115.

In the planar view of FIG. 17B, the area of the p-side electrode 107 is larger than the area of the n-side electrode 108. A contact area of the p-side electrode 107 and the second layer 112 is larger than the contact area of the n-side electrode 107 and the first layer 111.

Figure 18A:
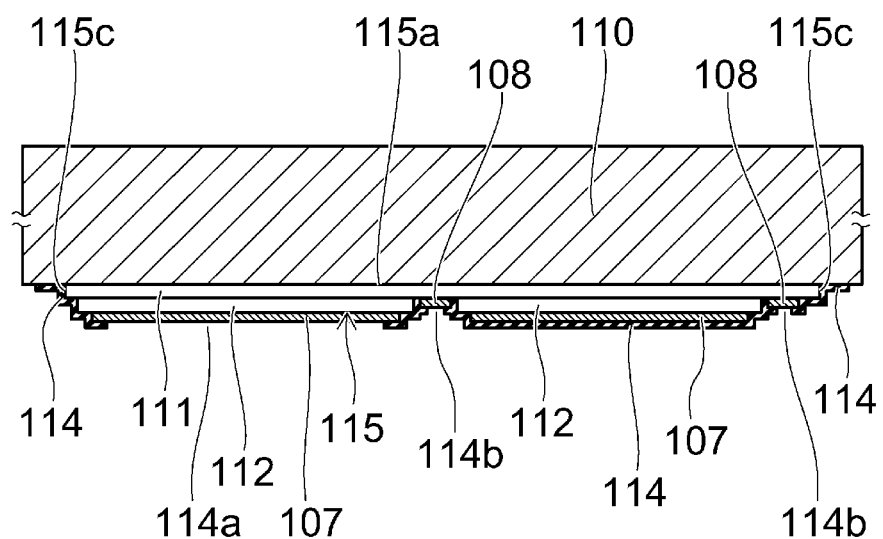
Figure 18B:
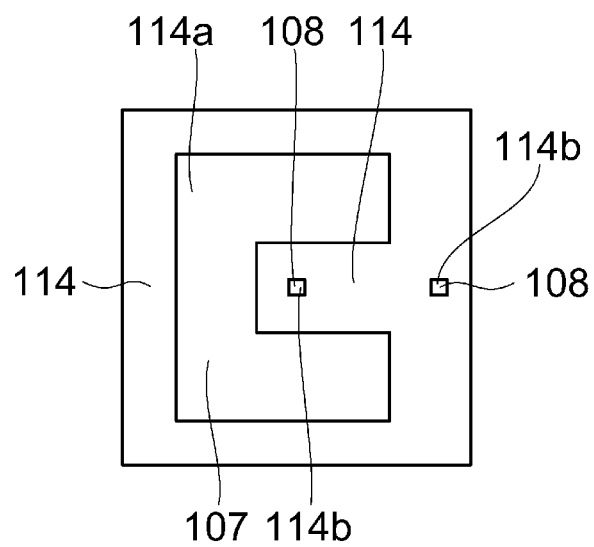

As illustrated in FIG. 18A and FIG. 18B corresponding to a lower face view of FIG. 18A, an insulating film 114 is provided on a face other than on the first face 115a of the semiconductor layer 115. The insulating film 114 is an inorganic film, and is, for example, a silicon oxide film.

In the insulating film 114, a first opening 114a where the p-side electrode 107 is exposed, and a second opening 114b where the n-side electrode 108 is exposed, are formed. For example, two n-side second openings 114b are formed to be spaced from each other. The surface of the p-side electrode 107 between two second openings 114b is covered with the insulating film 114.

The side face 115c of the first layer 111, the side face of the second layer 112, and the side face of the light emitting layer 113 are covered with the insulating film 114.

Figure 19A:
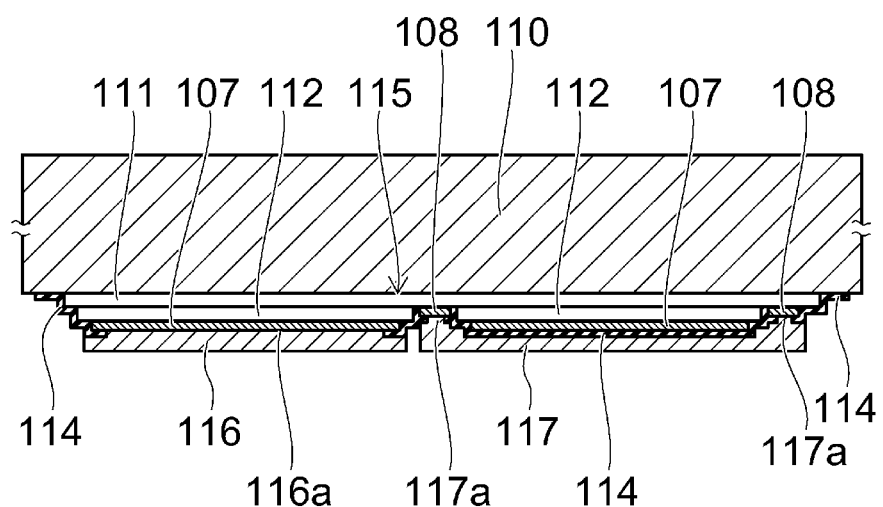
Figure 19B:
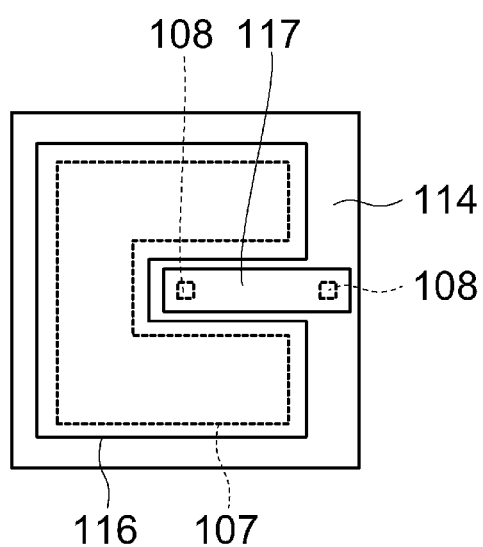

As illustrated in FIG. 19A and FIG. 19B corresponding to a lower face view of FIG. 19A, the first p-side wiring layer 116 and the first n-side wiring layer 117 are provided on the opposite side to the first face 115a of the semiconductor layer 115.

The first p-side wiring layer 116 is formed within the perimeter of the region (chip region) overlapping with the semiconductor layer 115. The first p-side wiring layer 116 is provided within the first opening 114a, and comes into contact with the p-side electrode 107. The first p-side wiring layer 116 is connected to the p-side electrode 107 through a contact section 116a which is integrally formed within the first opening 114a. The first p-side wiring layer 116 does not come into contact with the first layer 111.

The first n-side wiring layer 117 is formed within the perimeter of the region (chip region) overlapping with the semiconductor layer 115. The first n-side wiring layer 117 is provided within the second opening 114b, and comes into contact with the n-side electrode 108. The first n-side wiring layer 117 is connected to the n-side electrode 108 through a contact section 117a which is integrally formed within the second opening 114b.

For example, the first n-side wiring layer 117 is formed into a line pattern shape where two n-side electrodes 108 of the island shapes are extended in a bonding direction. The insulating film 114 is provided between a portion between two n-side electrodes 108 of the first n-side wiring layer 117, and the p-side electrode 107, and between a portion between two n-side electrodes 108 of the first n-side wiring layer 117, and the second layer 112. The first n-side wiring layer 117 does not come into contact with the p-side electrode 107 and the second layer 112.

As shown in FIG. 16B, the light emitting region 115d, including the light emitting layer 113, occupies most of a planar region of the semiconductor layer 115. Moreover, as illustrated in FIG. 17B, the area of the p-side electrode 107 which is connected to the light emitting region 115d is larger than the area of the n-side electrode 108. Therefore, a wide light emitting face is obtained, and a light output may be high.

Figure 26A:
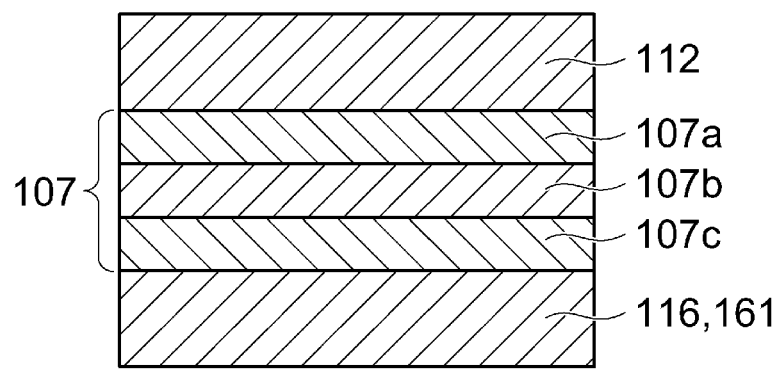
FIG. 26A and FIG. 26B are schematic enlarged cross-sectional views illustrating a portion of the semiconductor device manufactured according to the embodiments.

The p-side electrode 107 is provided between the second layer 112 and the first p-side wiring layer 116. As illustrated in FIG. 26A, the p-side electrode 107 is a layered film of a plurality of layers (for example, three layers). The p-side electrode 107 includes a first film 107a, a second film 107b, and a third film 107c which are provided in order from the second layer 112 side.

For example, the first film 107a is a silver (Ag) film having high reflectance with respect to the light which is emitted by the light emitting layer 113 and a fluorescent body layer 130. For example, the second film 107b is a titanium (Ti) film, and the third film 107c is a platinum (Pt) film.

Figure 26B:
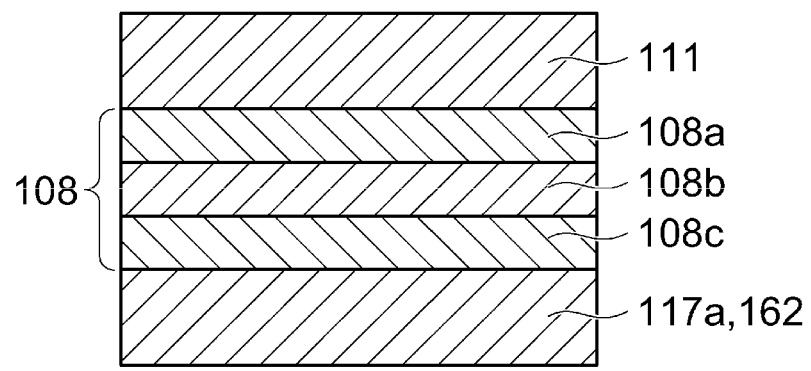

The n-side electrode 108 is provided between the first layer 111, and the contact section 117a of the first n-side wiring layer 117. As illustrated in FIG. 26B, the n-side electrode 108 is a layered film of the plurality of layers (for example, three layers). The n-side electrode 108 has a first film 108a, a second film 108b, and a third film 108c which are provided in order from the first layer 111 side.

For example, the first film 108a is an aluminum (Al) film having high reflectance with respect to the light which is emitted by the light emitting layer 113 and the fluorescent body layer 130. For example, the second film 108b is the titanium (Ti) film, and the third film 108c is the platinum (Pt) film.

Figure 20A:
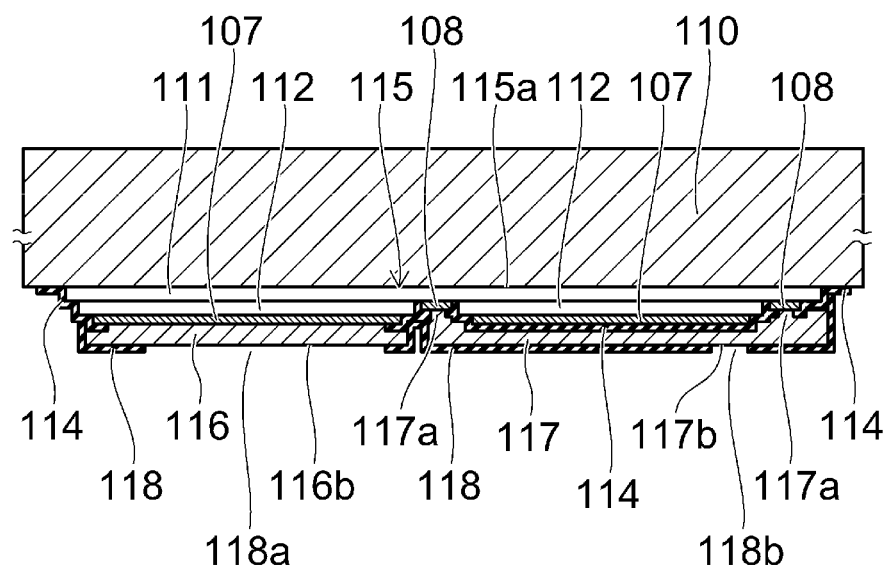
Figure 20B:
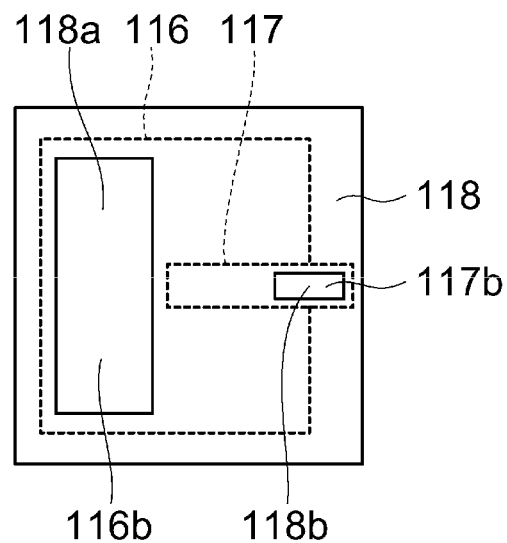

As illustrated in FIG. 20A and FIG. 20B corresponding to a lower face view of FIG. 20A, an insulating film 118 is provided on the surfaces of the first p-side wiring layer 116 and the first n-side wiring layer 117. The insulating film 118 is provided between the first p-side wiring layer 116 and the first n-side wiring layer 117. For example, the insulating film 118 is an inorganic film, and is a silicon oxide film, or the like.

In the insulating film 118, a first opening 118a where a portion (p-side pad 116b) of the first p-side wiring layer 116 is exposed, and a second opening 118b where a portion (n-side pad 117b) of the first n-side wiring layer 117 is exposed, are formed.

The area of the p-side pad 116b is larger than the area of the n-side pad 117b. The area of the n-side pad 117b is larger than the contact area of the first n-side wiring layer 117 and the n-side electrode 108.

The substrate 110 on the first face 115a is removed as described later. On the first face 115a where the substrate 110 is removed, the optical layers giving desired optical properties to the radiated light of the semiconductor device are arranged. For example, as illustrated in FIG. 13, the fluorescent body layer 130 is provided on the first face 115a of the semiconductor layer 115. Furthermore, a transparent layer (first transparent layer) 133 is provided on the fluorescent body layer 130. In this context, "optical layers" refer to device layers which are at least partially transparent to light emitted by a light emitting layer (e.g., light emitting layer 113) within the device. The "optical layers" are those device layers through which, by design, generated light is intended to traverse before emission to the outside of the device.

The fluorescent body layer 130 includes a plurality of fluorescent bodies 131. The fluorescent body 131 is excited by the radiated light from the light emitting layer 113, and then radiates light having a wavelength which is different from the radiated light from the light emitting layer 113. The plurality of fluorescent bodies 131 are dispersed in a bonding material 132. The radiated light of the light emitting layer 113 and the radiated light of the fluorescent body 131 are transmitted through the bonding material 132. Here, the term of "are transmitted through" is not limited to a case of transmittance of 100%, and also includes a case of partial transmittance. For example, a transparent resin such as a silicone resin may be used in the bonding material 132.

The transparent layer 133 does not include fluorescent particles. Moreover, the transparent layer 133 protects the fluorescent body layer 130 during grinding the surface of the insulating member 127 described later.

Alternatively, the transparent layer 133 functions as a light scatter layer. That is, the transparent layer 133 includes a plurality of particulate scattering materials (for example, silicon oxide or titanium compounds) by which the radiated light of the light emitting layer 113 is scattered, and the bonding material (for example, transparent resin) through which the radiated light of the light emitting layer 113 is transmitted.

In a region beyond the outer edge of the chip 103, a on the outside further than the side face of the semiconductor layer 115, the insulating member 127 is provided. The insulating member 127 is thicker than the semiconductor layer 115 and supports the semiconductor layer 115. The insulating member 127 covers the side face of the semiconductor layer 115 via the insulating film 114.

Moreover, the insulating member 127 is provided also on the outside of the side faces of the optical layers (e.g., fluorescent body layer 130 and transparent layer 133), and covers the side faces of the optical layers.

The insulating member 127 is provided surrounding periphery of the chip 103 (including the semiconductor layer 115, the electrodes 107 and 108, the first wiring layers (on-chip wiring layers) 116 and 117, and the optical layers) and supports the chip 103.

An upper face 127a of the insulating member 127 and an upper face of the transparent layer 133 form a substantially flat face. On a rear face of the insulating member 127, an insulating film 126 is provided.

On the first p-side pad 116b of the first p-side wiring layer 116, a second p-side wiring layer 121 is provided. The second p-side wiring layer 121 comes into contact with the first p-side pad 116b of the first p-side wiring layer 116, and is extended into the region beyond the periphery of the chip 103. The extended portion of the second p-side wiring layer 121 is supported by the insulating member 127 via the insulating film 126.

Moreover, a portion of the second p-side wiring layer 121 is also extended into the region overlapping with the first n-side wiring layer 117, via the insulating film 118.

On the first n-side pad 117b of the first n-side wiring layer 117, a second n-side wiring layer 122 is provided. The second n-side wiring layer 122 comes into contact with the first n-side pad 117b of the first n-side wiring layer 117, and is extended into the region beyond chip 103. The portion of the second n-side wiring layer 122 is supported by the insulating member 127 via the insulating film 126.

Figure 25B:
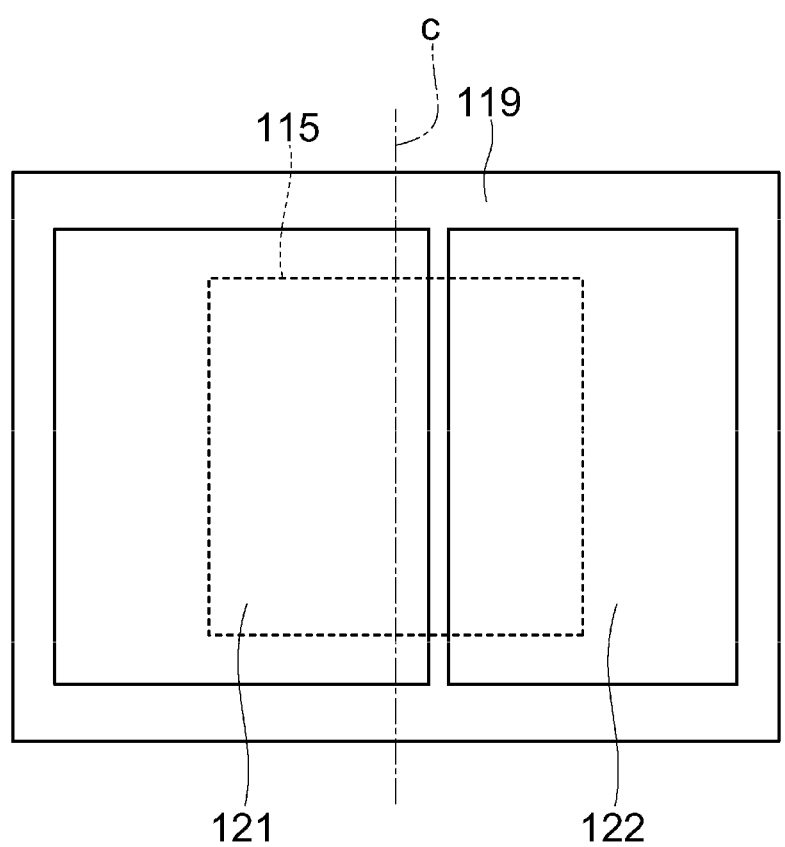

FIG. 25B illustrates an example of a planar layout of the second p-side wiring layer 121 and the second n-side wiring layer 122.

The second p-side wiring layer 121 and the second n-side wiring layer 122 are asymmetrically provided with respect to a center line c bisecting the planar region of the semiconductor layer 115, and the lower face (face of the installation face side) of the second p-side wiring layer 121 is larger than the lower face of the second n-side wiring layer 122.

As shown in FIG. 13, an insulating film 119 is provided on the surfaces of the second p-side wiring layer 121 and the second n-side wiring layer 122. For example, the insulating film 119 is an inorganic film, and is a silicon oxide film, or the like.

Figure 22:
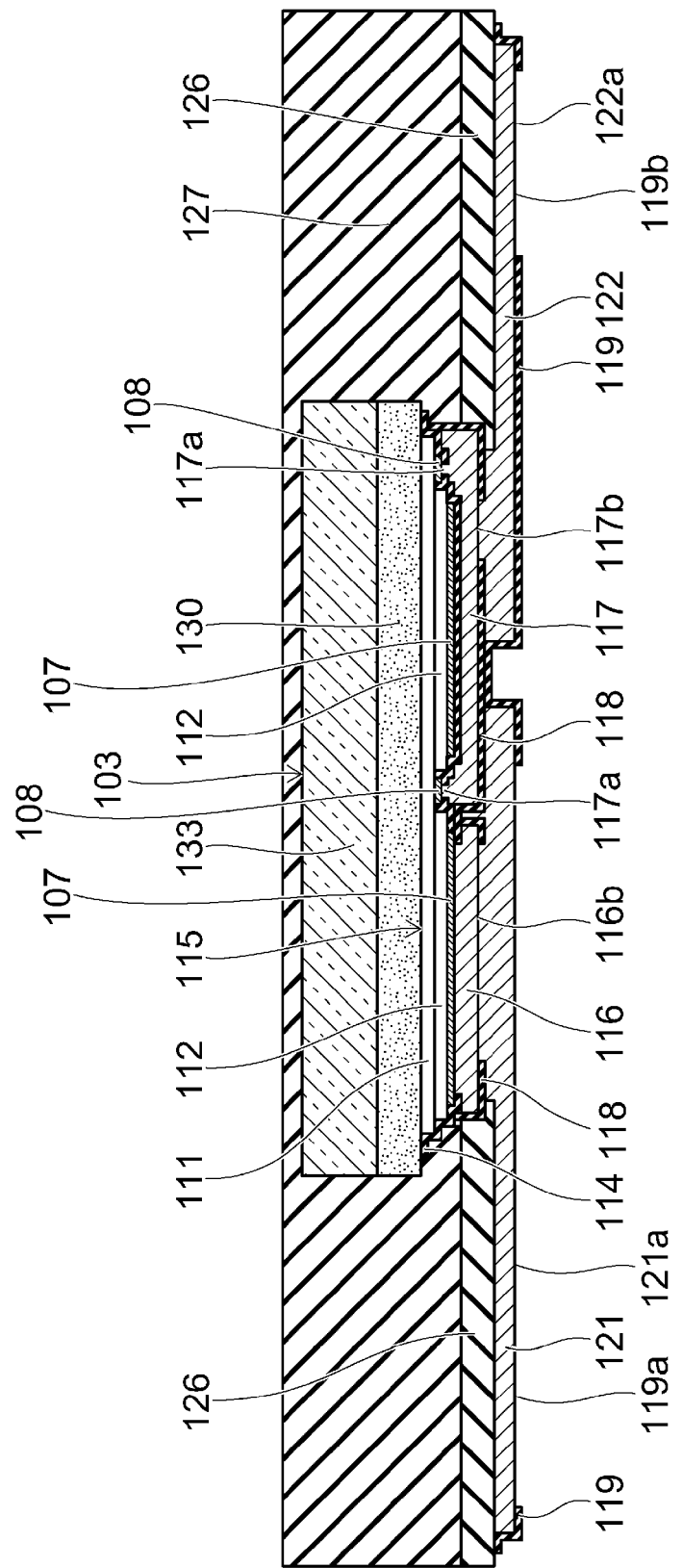

As illustrated in FIG. 22, in the insulating film 119, a first opening 119a, where a second p-side pad 121a of the second p-side wiring layer 121 is exposed, and a second opening 119b, where a second n-side pad 122a of the second n-side wiring layer 122 is exposed, are formed.

As illustrated in FIG. 13, on the second p-side pad 121a of the second p-side wiring layer 121, a p-side outside connection electrode 123 is provided. The p-side outside connection electrode 123 comes into contact with the second p-side pad 121a of the second p-side wiring layer 121 and is provided on the second p-side wiring layer 121.

Moreover, a portion of the p-side outside connection electrode 123 is provided in the region overlapping with the first n-side wiring layer 117 through the insulating films 118 and 119, and is provided in the region overlapping with the second n-side wiring layer 122, via the insulating film 119.

The p-side outside connection electrode 123 extends in the chip region overlapping with the semiconductor layer 115, and the region beyond the chip 103. The p-side outside connection electrode 123 is thicker than the first p-side wiring layer 116 and is thicker than the second p-side wiring layer 121.

On the second n-side pad 122a of the second n-side wiring layer 122, an n-side outside connection electrode 124 is provided. The n-side outside connection electrode 124 is disposed in the region out of the chip, and comes into contact with the second n-side pad 122a of the second n-side wiring layer 122.

The n-side outside connection electrode 124 is thicker than the first n-side wiring layer 117 and is thicker than the second n-side wiring layer 122.

Between the p-side outside connection electrode 123 and the n-side outside connection electrode 124, a resin layer (insulating layer) 125 is provided. The resin layer 125 comes into contact with the side face of the p-side outside connection electrode 123, and the side face of the n-side outside connection electrode 124. The resin layer 125 is inserted between the p-side outside connection electrode 123 and the n-side outside connection electrode 124.

Additionally, the resin layer 125 is provided in the vicinity of the p-side outside connection electrode 123, and in the vicinity of the n-side outside connection electrode 124. The resin layer 125 covers the side face of the p-side outside connection electrode 123, and the side face of the n-side outside connection electrode 124.

The resin layer 125 enhances the mechanical strength of the p-side outside connection electrode 123, and the mechanical strength of the n-side outside connection electrode 124. Moreover, the resin layer 125 functions as a solder barrier limiting spreading of solder during the installation processing (soldering).

The lower face of the p-side outside connection electrode 123 is exposed from the resin layer 125 and functions as a p-side installation face (p-side outside terminal) 123a which is connectable to an external circuit such as an installation substrate. The lower face of the n-side outside connection electrode 124 is exposed from the resin layer 125 and functions as an n-side installation face (n-side outside terminal) 124a which is connectable to the external circuit such as the installation substrate. For example, the p-side installation face 123a and the n-side installation face 124a are bonded to a landing pattern on the installation substrate through solder, conductive paste, or the like.

Here, it is preferable that the p-side installation face 123a and the n-side installation face 124a protrude beyond the surface of the resin layer 125. Hereby, a solder shape of the connection section is stabilized during the installation, and reliability of the installation may be improved.

FIG. 14 shows an example of a planar layout of the p-side installation face 123a and the n-side installation face 124a.

The p-side installation face 123a and the n-side installation face 124a are asymmetrically provided with respect to the center line c bisecting the planar region of the semiconductor layer 115, and the p-side installation face 123a is wider than the n-side installation face 124a.

The interval of the p-side installation face 123a and the n-side installation face 124a is set to be an interval where the solder does not bridge the space between the p-side installation face 123a and the n-side installation face 124a during the installation.

The n-side electrode contact face (second face 111a of the first layer 111) in the semiconductor layer 115, is rearranged in the wider region including the region out of the chip, by the first n-side wiring layer 117 and the second n-side wiring layer 122. Hereby, the area of the n-side installation face 124a, which is sufficient in the installation of high reliability, is secured, and the area of the n-side electrode face in the semiconductor layer 115 may be small. Therefore, in the semiconductor layer 115, the area of the region 115e which does not include the light emitting layer 113 is reduced, the area of the region 115d which includes the light emitting layer 113 becomes large, and it is possible to improve the light output.

In the semiconductor device, the p-side metal layer 171 and the n-side metal layer 172 are provided on the installation face side. The p-side metal layer 171 includes the first p-side wiring layer 116, the second p-side wiring layer 121, and the p-side outside connection electrode 123. The n-side metal layer 172 includes the first n-side wiring layer 117, the second n-side wiring layer 122, and the n-side outside connection electrode 124.

The semiconductor layer 115 is formed on the substrate by an epitaxial growth method. The substrate is subsequently removed, and the semiconductor layer 115 does not require the substrate on the first face 115a side. By the removal of the substrate, lowering of a height of the semiconductor device is achieved. Moreover, by the removal of the substrate, it is possible to form minute concave and convex sections (optical roughness) on the first face 115a of the semiconductor layer 115, and the improvement of light extraction efficiency can be achieved.

The semiconductor layer 115 is supported on a support body which is made up of a complex body of the metal layers 171 and 172 (see FIG. 13), and the resin layer 125. Moreover, the semiconductor layer 115 is supported from the side face side, for example, by the insulating member 127 which is thicker than the semiconductor layer 115, and is a resin layer.

As metal layers 171 and 172, for example, copper, gold, nickel, silver, or the like may be used. In the materials, if copper is used, it is possible to improve heat conductivity, high migration resistance, and the adhesive properties with respect to the insulating material.

By heating during the installation of the semiconductor device, stress which is caused by the solder bonding the p-side installation face 123a and the n-side installation face 124a to the land of the installation substrate is added to the semiconductor layer 115. The p-side outside connection electrode 123, the n-side outside electrode 124, and the resin layer 125 are formed into the appropriate thickness (height), whereby the p-side outside connection electrode 123, the n-side outside connection electrode 124, and the resin layer 125 may absorb and relieve the above stress. In particular, the resin layer 125, which is flexible more than the semiconductor layer 115, is used as a portion of the support body on the installation face side, whereby it is possible to enhance the stress relief effect.

For example, the metal layers 171 and 172 include copper having high heat conductivity as a main component, and high heat conductivity body in the region overlapping with the light emitting layer 113 extends in the wide area. The heat which is generated in the light emitting layer 113 is radiated to the installation substrate with a short pass which is formed from the chip downwards, through the metal layers 171 and 172.

In particular, since the p-side installation face 123a of the p-side metal layer 171 which is connected to the light emitting region 115d of the semiconductor layer 115, overlaps with most of the planar region of the semiconductor layer 115 which is illustrated in FIG. 14 at planar view, the heat may be radiated to the installation substrate with high efficiency, through the p-side metal layer 171.

Moreover, in the semiconductor device, the p-side installation face 123*a* is expanded in the region out of the chip. Therefore, the planar size of the solder which is bonded to the p-side installation face 123*a* may be large, and it is possible to improve heat radiation properties to the installation substrate through the solder.

Additionally, the second n-side wiring layer 122 is extended in the region beyond the chip 103. Hence, without restriction of the p-side installation face 123*a* which is laid out to occupy most of the region overlapping with the chip, it is possible to position the n-side installation face 124*a* in the region beyond the chip 103. The n-side installation face 124*a* is positioned in the region beyond the chip 103, and thereby, the area of the n-side installation face 124*a* may be larger than the case where the n-side installation face 124*a* is laid out only within the perimeter of the chip region.

Therefore, in the n-side, the planar size of the solder which is bonded to the n-side installation face 124*a* may be large, and it is possible to improve the heat radiation properties to the installation substrate through the solder.

The light, radiated to the first face 115*a* from the light emitting layer 113, enters the fluorescent body layer 130. A portion of the light excites the fluorescent body 131, and for example, white light is obtained as mixed light of the light from the light emitting layer 113 and the light from the fluorescent body 131.

The light that is radiated to the installation face side from the light emitting layer 113 is reflected by the p-side electrode 107 and the n-side electrode 108, and heads for the upward fluorescent body layer 130 side.

The transparent layer (first transparent layer) 133 is disposed on the fluorescent body layer 130. On the transparent layer 133 and the insulating member 127 of the region out of the chip, a transparent layer (second transparent layer) 134 is arranged.

The transparent layer 134 includes the plurality of particulate scattering materials (for example, silicon oxides) by which the radiated light of the light emitting layer 113 is scattered, and the bonding material (for example, transparent resin) through which the radiated light of the light emitting layer 113 is transmitted.

The transparent layer 134 functions as a light scatter layer. The area of the transparent layer 134 which is the light scatter layer is larger than the area of the fluorescent body layer 130, and the area of the transparent layer 133. That is, the area of the transparent layer 134 is larger than the area of the chip 103. Therefore, the angles of the light which is emitted to the outside from the semiconductor device may be wide, and light distribution properties of wide angle may be achieved.

In the insulating member 127, the surface of at least the portion which is adjacent to the side face of the semiconductor layer 115, has reflection properties with respect to the radiated light of the light emitting layer 113. Additionally, in the insulating member 127, the portion which is adjacent to the side face of the fluorescent body layer 130, and the portion which is adjacent to the side face of the transparent layer 133, have the reflection properties with respect to the radiated light of the light emitting layer 113 and the radiated light of the fluorescent body 131.

Furthermore, the vicinity of boundaries of the insulating member 127 to the transparent layer 134, have the reflection properties with respect to the radiated light of the light emitting layer 113 and the radiated light of the fluorescent body 131.

For example, the insulating member 127 is a resin layer of which reflectivity is 50% or more with respect to the radiated light of the light emitting layer 113 and the radiated light of the fluorescent body 131.

Therefore, the radiated light from the side face of the chip 103, and the light which is scattered by the transparent layer 134 and heads for the insulating member 127 side may be reflected by the insulating member 127. Since absorption loss of the light is prevented by the insulating member 127, it is possible to enhance the light extraction efficiency to the outside through the transparent layer 134.

The fluorescent body layer 130 is formed in a wafer level process on the first face 115*a* of the semiconductor layer 115. The area of the fluorescent body layer 130 is almost the same as the area of the semiconductor layer 115, or is slightly larger than the area of the semiconductor layer 115.

The fluorescent body layer 130 is not formed to go around the side face of the semiconductor layer 115, and the installation face side. That is, in the chip side face side and the installation face side where the light is not extracted to the outside, the fluorescent body layer 130 is not formed uselessly, and the reduction in cost is achieved.

In the installation of a flip chip-type device, after an LED chip is installed in the installation substrate through a solder bump (e.g., microbumps) or the like, the fluorescent body layer is formed to cover the entire chip. Alternatively, the resin may fill between the bumps.

In contrast, according to the semiconductor device which is manufactured using the manufacturing apparatus of a semiconductor device according to the embodiment, in the state before the installation which is illustrated in FIG. 13, the resin layer 125, which is different from the fluorescent body layer 130, is disposed in the vicinity of the p-side outside connection electrode 123, and in the vicinity of the n-side outside connection electrode 124, and it is possible to give the properties which are appropriate for stress relief to the installation face side. Moreover, since the resin layer 125 has been already disposed on the installation face side, the filling of the resin between the bumps after the installation is not necessary.

On the first face 115*a* side of the semiconductor layer 115, the optical layers having a design which is preferable in light extraction efficiency, color conversion efficiency, light distribution properties, or the like, are disposed. On the installation face side, the layer which is preferable adopted for stress relief during the installation process, and in the properties as a support body instead of the substrate, is disposed. For example, the resin layer 125 has a structure in which the resin as a base is filled with a filler such as silica particles at high density, and is adjusted to have appropriate hardness as a support body.

According to the semiconductor device which is manufactured using the manufacturing apparatus of a semiconductor device according to the embodiment described above, the semiconductor layer 115, the electrodes 107 and 108, the on-chip wiring layers 116 and 117, and the optical layers are collectively formed at the wafer level, and the chip size device 103 of the low cost is thereby achieved. The outside terminals (installation faces) 123*a* and 134*a* may be expanded into the region beyond the chip 103, and the heat radiation properties may be consequently be high. Therefore, it is possible to provide the semiconductor device of high reliability at a reduced price.

Next, a manufacturing method of a semiconductor device according to a second embodiment, will be described with reference to FIG. 16A to FIG. 25B.

FIG. 16B, FIG. 17B, FIG. 18B, FIG. 19B, FIG. 20B, FIG. 25A, and FIG. 25B correspond to lower face views of FIG. 16A, FIG. 17A, FIG. 18A, FIG. 19A, FIG. 20A, FIG. 21, and FIG. 22, respectively.

The semiconductor layer 115 is provided by epitaxial-growth on the substrate 110 by, for example, a metal organic chemical vapor deposition (MOCVD) method. The substrate 110 is, for example, a silicon substrate. Alternatively, the substrate 110 may be a sapphire substrate, or a silicon carbide substrate. For example, the semiconductor layer 115 is a nitride semiconductor layer including gallium nitride (GaN).

For example, by the reactive ion etching (RIE) method, the layered film of the second layer 112 and the light emitting layer 113 is selectively etched, and the second face 111a of the first layer 111 is exposed, as illustrated in FIG. 16A and FIG. 16B.

Moreover, the first layer 111 is selectively removed, and is separated into the plurality of semiconductor layers 115. For example, a groove separating the semiconductor layer 115 into a plurality of portions is formed having lattice shaped pattern.

Next, as illustrated in FIG. 17A and FIG. 17B, the p-side electrode 107 is formed on the surface of the second layer 112, and the n-side electrode 108 is formed on the second face 111a of the first layer 111.

Sequentially, as illustrated in FIG. 18A and FIG. 18B, after the insulating film 114 is formed to cover the semiconductor layer 115 and the electrodes 107 and 108, the first opening 114a and the second opening 114b are formed in the insulating film 114.

Next, as illustrated in FIG. 19A and FIG. 19B, the first p-side wiring layer 116 and the first n-side wiring layer 117 are formed. The first p-side wiring layer 116 comes into contact with the p-side electrode 107 which is formed within the first opening 114a.

The first n-side wiring layer 117 comes into contact with the n-side electrode 108 which is formed within the second opening 114b. Additionally, the first n-side wiring layer 117 comes into contact with the n-side electrode 108, for example, in two places. The first n-side wiring layer 117 is formed into a line shape where the n-side electrode 108 of the two places is extended in the bonding direction. Between the portion of the first n-side wiring layer 117 which is formed into the line shape, and the p-side electrode 107, the insulating film. 114 is interposed, and the first n-side wiring layer 117 does not come into contact with the p-side electrode 107.

The p-side electrode 107, the n-side electrode 108, the first p-side wiring layer 116, and the first n-side wiring layer 117 are formed within the perimeter of the region overlapping with the semiconductor layer 115.

Next, as illustrated in FIG. 20A and FIG. 20B, the insulating film 118 is formed on the surface of the first p-side wiring layer 116, and the surface of the first n-side wiring layer 117. The first opening 118a and the second opening 118b are formed in the insulating film 118. In the first opening 118a, the first p-side pad 116b of the first p-side wiring layer 116 is exposed, and in the second opening 118b, the first n-side pad 117b of the first n-side wiring layer 117 is exposed.

The substrate 110 is then removed. In the state where a layered body including the semiconductor layer 115 and the wiring layers 116 and 117, is temporarily supported by a support body (which is not illustrated in the drawing), the substrate 110 is removed.

For example, the substrate 110, which is the silicon substrate, is removed by a dry etching process such as RIE. Alternatively, the silicon substrate 110 may be removed by wet etching. Alternatively, when the substrate 110 is the sapphire substrate, the substrate 110 may be removed by a laser lift off method.

The semiconductor layer 115, which is grown using epitaxial-growth on the substrate 110, may have large internal stress. Moreover, for example, the p-side metal layer 171, the n-side metal layer 172, and the resin layer 125 are relatively flexible materials in comparison with the semiconductor layer 115 that is formed of a GaN-based material. Therefore, even when the internal stress during the epitaxial growth is opened all at once during peeling of the substrate 110, the p-side metal layer 171, the n-side metal layer 172, and the resin layer 125 absorb the stress. Hence, it is possible to avoid damage of the semiconductor layer 115 in the process of removing the substrate 110.

The first face 115a of the semiconductor layer 115 which is exposed by the removal of the substrate 110 is roughened as necessary.

Furthermore, on the first face 115a, the fluorescent body layer 130 is formed as described above, and the transparent layer 133 is formed on the fluorescent body layer 130. These processes proceed while the devices are in the wafer state (pre-dicing stage).

Thereafter, the wafer is diced (singulated) into the plurality of chips 103. The chips 103 are transferred by the transfer source tape 31 as described above, is performed and the rearrangement of the chip 103 is performed using the manufacturing apparatus 100. Thereafter, as illustrated in FIG. 21, the insulating member (support member) 127 is formed in the vicinity (region beyond the chip 103) of the chip 103, and on the chip 103 (on the transparent layer 133).

On the lower face of the insulating member 127 in FIG. 21, the insulating film 126 is formed as illustrated in FIG. 22. Hereby, a height difference between the chip 103 and the insulating member 127 is eliminated, and it is possible to improve the reliability of the wiring layer which is formed thereafter. As an insulating film 126, various resin materials may be used, but in particular, imide-based resin, phenol-based resin, silicon-based resin, epoxy-based resin, and the like which are excellent in heat resistance, are suitable.

As illustrated in FIG. 22, the second p-side wiring layer 121 is formed on the first p-side pad 116b of the first p-side wiring layer 116, and on the insulating film 126 in the region beyond the chip 103. The second n-side wiring layer 122 is formed on the first n-side pad 117b of the first n-side wiring layer 117, and on the insulating film 126 in the region beyond the chip 103.

The alignment of the second n-side wiring layer 122 is performed with respect to each chip 103. Since the first n-side pad 117b is rearranged to have the area which is larger than the n-side electrode 108, even when the formation position of the second n-side wiring layer 122 slightly deviates with respect to the chip 103, the second n-side wiring layer 122 may be surely connected to the first n-side pad 117b so as to overlap with the first n-side pad 117b.

The insulating film 119 is formed on the surface of the second p-side wiring layer 121, and the surface of the second n-side wiring layer 122. The first opening 119a and the second opening 119b are formed in the insulating film 119. In the first opening 119a, the second p-side pad 121a of the second p-side wiring layer 121 is exposed. In the second opening 119b, the second n-side pad 122a of the second n-side wiring layer 122 is exposed.

Figure 23:
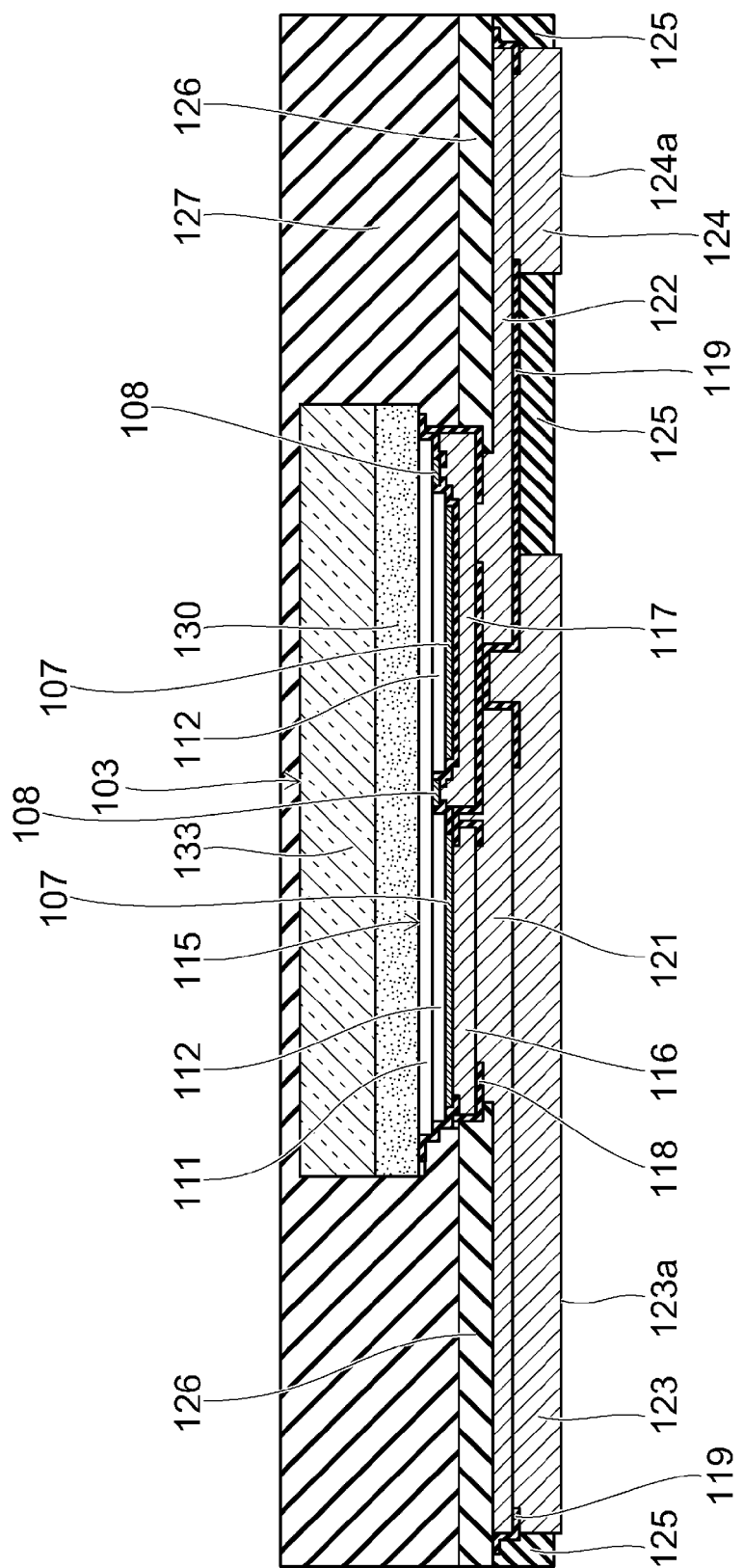

On the second p-side pad 121*a*, the p-side outside connection electrode 123 is formed as illustrated in FIG. 23. On the second n-side pad 122*a*, the n-side outside connection electrode 124 is formed. Furthermore, the resin layer 125 is formed between the p-side outside connection electrode 123 and the n-side outside connection electrode 124, in the vicinity of the p-side outside connection electrode 123, and in the vicinity of the n-side outside connection electrode 124.

Next, the upper face of the insulating member 127 on the transparent layer 133, and the upper face of the insulating member 127 in the region out of the chip are ground (polished). The insulating member 127 on the transparent layer 133 is removed, and the upper face of the transparent layer 133 and the insulating member 127 are flattened, as illustrated in FIG. 24.

The transparent layer 133 which remains on the fluorescent body layer 130 after grinding protects the fluorescent body 130.

As illustrated in FIG. 13, on the upper face of the flattened transparent layer 133, and on the upper face of the insulating member 127, the transparent layer (scatter layer) 134, having a planar size larger than the chip 103, is formed.

According to the disclosure, it is thus possible to provide the manufacturing apparatus of a semiconductor device, and the manufacturing method of a semiconductor device which are excellent in positional accuracy during the transfer of semiconductor devices.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions

What is claimed is:

1. A manufacturing apparatus, comprising:
   a first supporting section configured to support a first tape section, the first tape section having a first surface facing away from the first supporting section;
   a second supporting section configured to support a second tape section in a facing arrangement with the first tape section supported on the first supporting section, the second tape section having a second surface facing away from the second supporting section;
   a ring element configured to be between the first and second supporting sections when the first and second tape sections are in the facing arrangement, the ring element disposed at a periphery of a space that is between the first and second tape sections when in the facing arrangement, and having a port allowing fluid communication between the space and an outlet port;
   a first frame having a ring-like shape with an inner diameter that is greater than or equal to an outer diameter of the ring element; and
   a second frame having a ring-like shape with an inner diameter that is greater than or equal to the outer diameter of the rind element, wherein
   the first and second frames are configured such that when the first and second tape sections are in the facing arrangement, the first and second frames are between the first and second supporting sections, the ring element is disposed within the inner diameters of first and second frames, an outer peripheral portion of the first tape section is between the first frame and the first supporting section, and an outer peripheral portion of the second tape section is between the second frame and the second supporting section frame, and
   the ring element has a planar thickness that is greater than a sum of a planar thickness of the first frame and a planar thickness of the second frame.

2. The apparatus according to claim 1, wherein the ring element includes:
   a first passage that extends in the planar thickness direction of the ring element,
   a horizontal passage that is in fluid communication with the port in the ring element, and
   a connection section that is extended in a circumferential direction of the ring element and connects the vertical passage and the horizontal passage.

3. The apparatus according to claim 1, wherein the first frame includes a notch in an outer circumferential portion of the ring-like shape.

4. The apparatus according to claim 1, wherein the second frame includes a notch in an outer circumferential portion of the ring-like shape.

5. The apparatus according to claim 1, wherein the first and second frames comprise stainless steel.

6. The apparatus according to claim 1, wherein the ring element includes a plurality of ports allowing fluid communication between the space and the outlet port.

7. The apparatus according to claim 6, wherein the plurality of ports are provided at equal intervals along an inner circumference of the ring element.

8. A manufacturing apparatus, comprising:
   a first supporting section configured to support a first tape section, the first tape section having a first surface facing away from the first supporting section;
   a second supporting section configured to support a second tape section in a facing arrangement with the first tape section supported on the first supporting section, the second tape section having a second surface facing away from the second supporting section; and
   a ring element configured to be between the first and second supporting sections when the first and second tape sections are in the facing arrangement, the ring element disposed at a periphery of a space that is between the first and second tape sections when in the facing arrangement, and having a port allowing fluid communication between the space and an outlet port, wherein the ring element comprises an inner ring element formed of a flexible resin material and an outer ring element formed of a material less flexible than the flexible resin material, the inner ring element having a planar thickness greater than a planar thickness of the outer ring element, the outer ring element having an inner diameter greater than an inner diameter of the of the inner ring element.

9. The apparatus according to claim 1, wherein the second supporting section includes:
   a reinforcing plate that includes a through hole, and
   a transparent plate within the through hole and between the reinforcing plate and the second tape.

10. The apparatus according to claim 1, wherein the first and second supporting sections comprise stainless steel.

11. The apparatus according to claim 1, wherein the ring element comprises silicone.

12. The apparatus according to claim 1, wherein, when the first and second tape sections are in the facing arrangement, the port is in fluid communication with the outlet port via one of:
   a first through hole extending through the first supporting section and the first tape section, and
   a second through hole extending though the second supporting section and the second tape section; and
   a vacuum exhaust section is connected to the outlet port.

13. The apparatus according to claim 8, wherein the ring element includes a plurality of ports allowing fluid communication between the space and the outlet port.

14. The apparatus according to claim 8, wherein the second supporting section includes:
   a reinforcing plate that includes a through hole, and
   a transparent plate within the through hole and between the reinforcing plate and the second tape.

15. The apparatus according to claim 8, wherein the first and second supporting sections comprise stainless steel.

16. The apparatus according to claim 8, wherein the flexible resin material is silicone.

17. The apparatus according to claim 8, wherein, when the first and second tape sections are in the facing arrangement, the port is in fluid communication with the outlet port via one of:
   a first through hole extending through the first supporting section and the first tape section, and
   a second through hole extending though the second supporting section and the second tape section; and
   a vacuum exhaust section is connected to the outlet port.

* * * * *